US012647080B2

(12) United States Patent　　(10) Patent No.:　US 12,647,080 B2
Kogure　　(45) Date of Patent:　Jun. 2, 2026

(54) TRACKER MODULE, POWER AMPLIFIER MODULE, RADIO-FREQUENCY MODULE, AND COMMUNICATION DEVICE

(71) Applicant: Murata Manufacturing Co., Ltd., Nagaokakyo (JP)

(72) Inventor: Takeshi Kogure, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 523 days.

(21) Appl. No.: 18/448,733

(22) Filed: Aug. 11, 2023

(65) Prior Publication Data

US 2023/0402979 A1　　Dec. 14, 2023

Related U.S. Application Data

(63) Continuation of application No. PCT/JP2022/008832, filed on Mar. 2, 2022.

(30) Foreign Application Priority Data

Mar. 5, 2021　(JP) ................................. 2021-035736

(51) Int. Cl.
　H03F 3/24　　　(2006.01)
　H03F 1/02　　　(2006.01)
(52) U.S. Cl.
　CPC ........... H03F 3/245 (2013.01); H03F 1/0211 (2013.01); H03F 1/0222 (2013.01)
(58) Field of Classification Search
　CPC . H03F 3/245; H03F 1/02; H03F 3/195; H04B 1/03; H04B 1/04

USPC ........................................ 330/295, 136, 297
See application file for complete search history.

(56) References Cited

U.S. PATENT DOCUMENTS

| | | | |
|---|---|---|---|
| 2012/0139641 A1* | 6/2012 | Kaczman .............. | H03F 1/0222 330/295 |
| 2016/0036389 A1 | 2/2016 | Balteanu et al. | |
| 2020/0076375 A1 | 3/2020 | Khlat | |
| 2020/0358405 A1 | 11/2020 | Tanaka et al. | |

FOREIGN PATENT DOCUMENTS

| | | |
|---|---|---|
| JP | 2016032301 A | 3/2016 |
| JP | 2020184665 A | 11/2020 |

OTHER PUBLICATIONS

International Search Report in PCT/JP2022/008832, mailed Jun. 7, 2022, 3 pages.

* cited by examiner

*Primary Examiner* — Khiem D Nguyen
(74) *Attorney, Agent, or Firm* — ArentFox Schiff LLP

(57)　　　ABSTRACT

A tracker module is provided that includes a substrate, a tracker component, and multiple external connection terminals. The tracker component generates voltage. The multiple external connection terminals are on a second main surface of the substrate. The multiple external connection terminals include three or more first output terminals that correspond to three or more first power amplifiers of the multiple power amplifiers. Each of the three or more first output terminals is connected to the tracker component and is a terminal connected to the corresponding first power amplifier of the three or more first power amplifiers. The three or more first output terminals are arranged along an outermost periphery on the second main surface of the substrate.

20 Claims, 13 Drawing Sheets

TRACKER MODULE, POWER AMPLIFIER MODULE, RADIO-FREQUENCY MODULE, AND COMMUNICATION DEVICE

CROSS REFERENCE TO RELATED APPLICATIONS

This application is a continuation of International Application No. PCT/JP2022/008832, filed Mar. 2, 2022, which claims priority to Japanese Patent Application No. 2021-035736, filed Mar. 5, 2021, the entire contents of each of which are hereby incorporated by reference in their entirety.

TECHNICAL FIELD

The present invention generally relates to tracker modules, power amplifier modules, radio-frequency modules, and communication devices, and, more specifically, to a tracker module including a tracker component, a power amplifier module including the tracker module, a radio-frequency module, and a communication device.

BACKGROUND

Envelope tracking circuits (E.G., tracker modules) using an envelope tracking method (hereinafter referred to as an "ET method") are known in recent years, for example, as described in U.S. Patent Application Publication No. 2020/0076375 (hereinafter "Patent Document 1"). The ET method is a method in which the amplitude of power supply voltage of an amplifier element in a power amplifier is varied in accordance with the amplitude of the envelope of a radio-frequency signal. More specifically, the ET method is a method in which the collector voltage of a transistor, which is an amplifier element in a power amplifier, is varied in accordance with output voltage to reduce loss in power occurring in an operation when the power supply voltage is fixed, thus realizing high efficiency.

The envelope tracking circuit described in Patent Document 1 varies the power supply voltage of an amplifier circuit (e.g., a power amplifier) in accordance with the amplitude of the envelope of a transmission signal input into the amplifier circuit and supplies the power supply voltage to the amplifier circuit.

In the configuration of the tracker module described in Patent Document 1, the wiring length between an output terminal connected to the power amplifier and the power amplifier may be lengthened.

SUMMARY OF THE INVENTION

Accordingly, it is an object of the present invention to provide a tracker module, a power amplifier module, a radio-frequency module, and a communication device, which shorten the wiring length between the output terminal connected to the power amplifier and the power amplifier.

In an exemplary aspect, a tracker module is provided that is configured to output voltage to multiple power amplifiers. In this aspect, the tracker module includes a substrate, a tracker component, and multiple external connection terminals. The substrate has a first main surface and a second main surface that are opposed to each other. The tracker component is arranged on the first main surface of the substrate and is configured to generate the voltage. The multiple external connection terminals are arranged on the second main surface of the substrate and include three or more first output terminals. The three or more first output terminals correspond to three or more first power amplifiers, among the multiple power amplifiers. Each of the three or more first output terminals is connected to the tracker component and is a terminal connected to the corresponding first power amplifier, among the three or more first power amplifiers. Moreover, the three or more first output terminals are arranged along an outermost periphery on the second main surface of the substrate.

In an exemplary aspect, a power amplifier module is provided that includes the tracker module and the first power amplifiers.

In another exemplary aspect, a radio-frequency module is provided that includes the tracker module, the first power amplifiers, and a transmission filter. Moreover, the transmission filter transmits a transmission signal amplified by the first power amplifiers.

In an exemplary aspect, a communication device is provided that includes the tracker module, the first power amplifiers, and a signal processing circuit. In this aspect, the signal processing circuit outputs a transmission signal to the first power amplifiers.

According to the tracker module, the power amplifier module, the radio-frequency module, and the communication device described herein, the wiring lengths between the first output terminals connected to the first power amplifiers and the first power amplifiers are shortened.

DETAILED DESCRIPTION OF EMBODIMENTS

Figure 1:
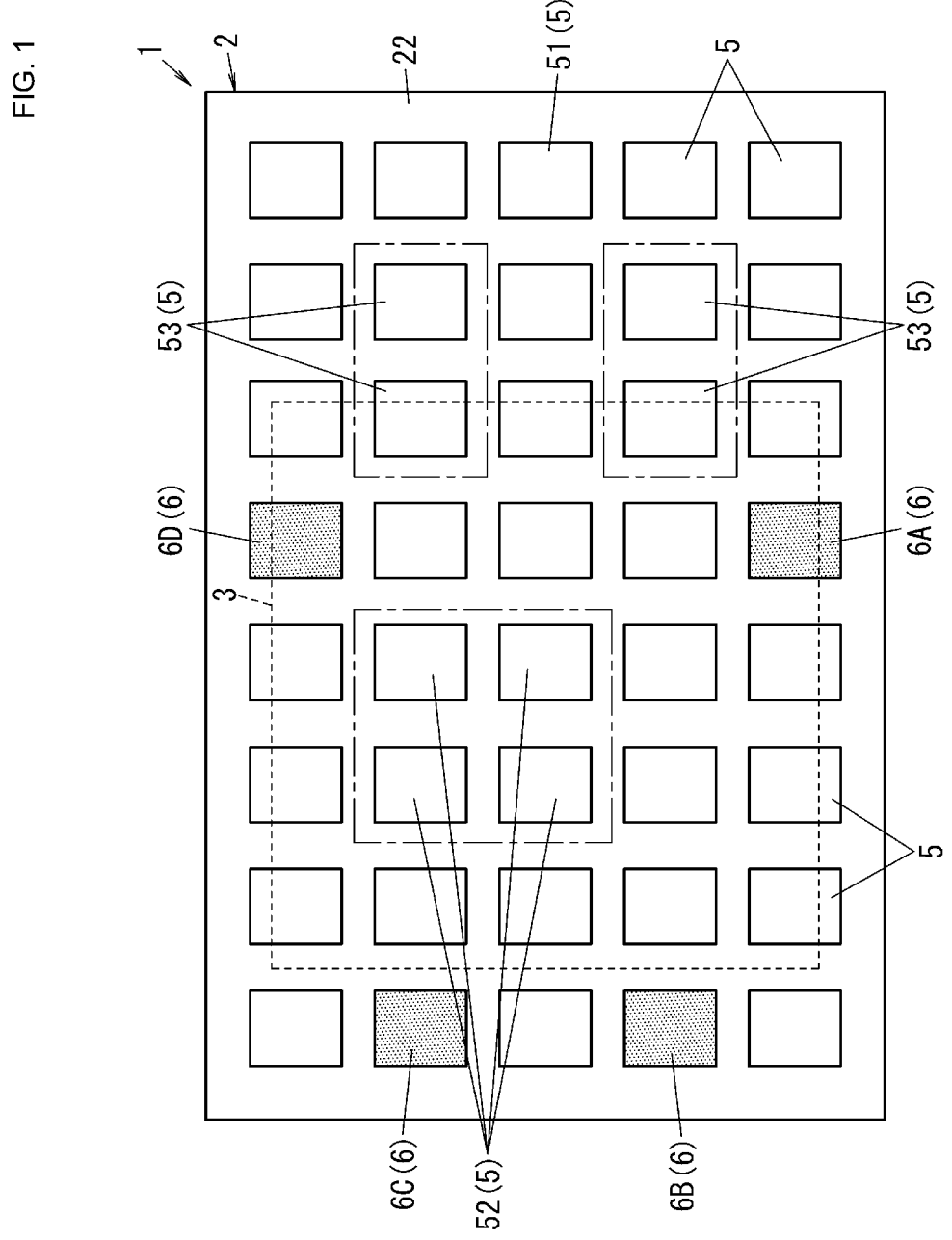
FIG. 1 is a perspective view of a tracker module according to a first exemplary embodiment.

Tracker modules according to first to fourth exemplary embodiments will herein be described with reference to the drawings. The respective drawings referred to in the embodiments described below and so on are schematic diagrams. It is noted that the sizes and the thicknesses of the respective components in the drawings and the ratios therebetween do not necessarily reflect the actual dimensional ratios.

First Exemplary Embodiment

(1) Tracker Module

A configuration of a tracker module 1 according to a first exemplary embodiment will now be described with reference to the drawings.

Figure 3:
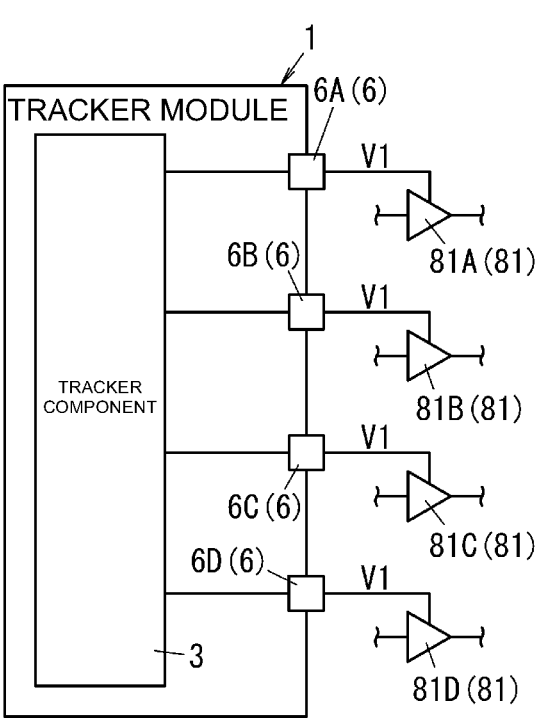
FIG. 3 is a block diagram illustrating a configuration of the tracker module in FIG. 1.

The tracker module 1 according to the first embodiment is configured so as to supply power supply voltage V1 to multiple (e.g., four in the drawing) first power amplifiers 81, as illustrated in FIG. 3. In the tracker module 1, one tracker component 3 supports multiple communication bands. The multiple first power amplifiers 81 are configured so as to amplify a first transmission signal (e.g., a radio-frequency signal) upon application of the power supply voltage V1 to their amplifier elements (not illustrated). The multiple first power amplifiers 81 amplify transmission signals in different communication bands.

Figure 4:
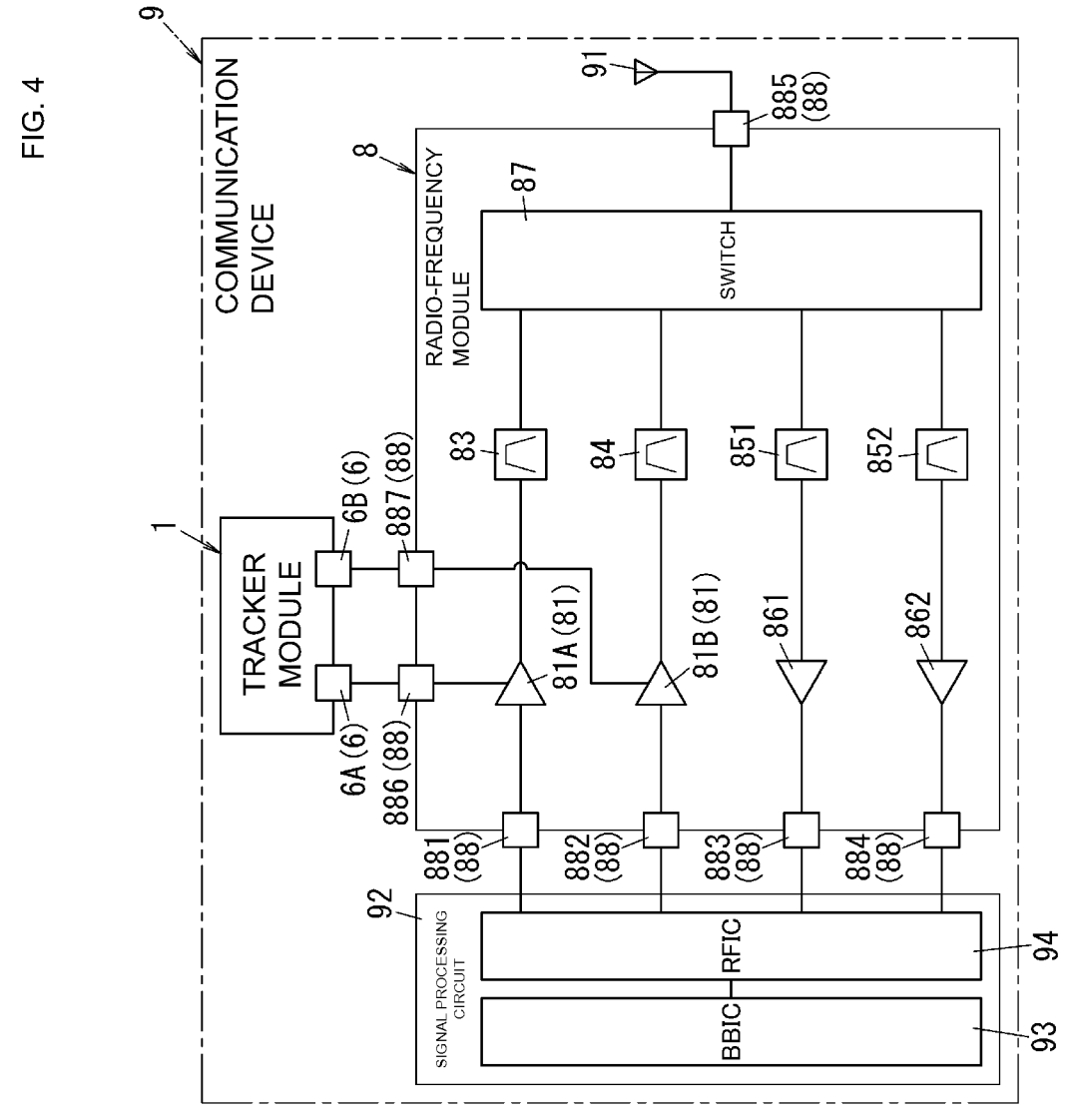
FIG. 4 is a conceptual diagram illustrating a configuration of a communication device according to the first exemplary embodiment.

According to an exemplary aspect, the tracker module 1 is used in, for example, a communication device 9, as illustrated in FIG. 4. More specifically, the tracker module 1 is used in the communication device 9 along with the multiple first power amplifiers 81 included in a radio-frequency module 8.

For example, the communication device 9 is a mobile phone, such as a smartphone. However, the communication device 9 is not limited to the mobile phone and may be a wearable terminal or the like, such as a smartwatch. The radio-frequency module 8 is a module configured to support, for example, the fourth generation mobile communication (4G) standards, the fifth generation mobile communication (5G) standards, and so on. The 4G standards are, for example, Third Generation Partnership Project (3GPP) Long Term Evolution (LTE) standards. The 5G standards are, for example, 5G New Radio (NR). The radio-frequency module 8 is a module configured to support carrier aggregation and dual connectivity.

The communication device 9 performs communication in multiple communication bands. More specifically, the communication device 9 performs transmission of transmission signals in multiple communication bands and reception of reception signals in multiple communication bands.

Part of the transmission signals and the reception signal in the multiple communication bands is frequency division duplex (FDD) signals. The transmission signals and the reception signals in the multiple communication bands are not limited to the FDD signals and may be time division duplex (TDD) signals. The FDD is a wireless communication technology in which different frequency bands are allocated to the transmission and the reception in wireless communication for transmission and reception. The TDD is a wireless communication technology in which the same frequency band is allocated to the transmission and the reception in the wireless communication and a time-based switching between the transmission and the reception is performed.

Figure 2:
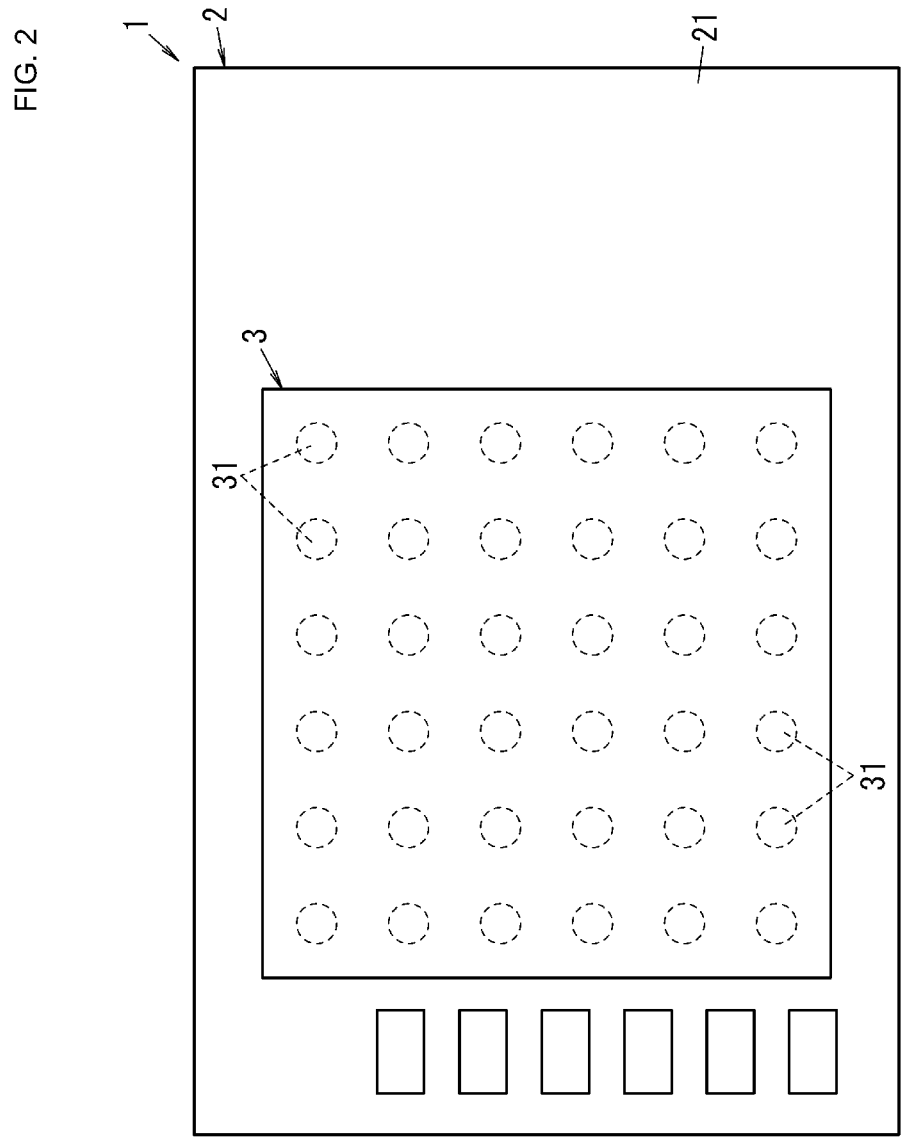
FIG. 2 is a plan view of the tracker module in FIG. 1.

The tracker module 1 according to the first embodiment includes a substrate 2, the tracker component 3, and multiple (forty in the example illustrated in drawing) external connection terminals 5, as illustrated in FIG. 1 and FIG. 2. The tracker module 1 is connected to, for example, the battery (not illustrated) of a terminal or the like in which the radio-frequency module 8 (refer to FIG. 4) is installed and battery voltage is supplied from the battery to the tracker module 1.

In the amplification of the transmission signals by the first power amplifiers 81 using the power supply voltage V1 from the tracker module 1, an envelope tracking method (hereinafter referred to as an "ET method") is used.

The ET method is a method in which the amplitude level of power supply voltage of amplifier elements in power amplifiers is varied in accordance with the amplitudes of the envelopes of radio-frequency signals. More specifically, the ET method is a method in which the envelopes of the amplitudes of transmission signals (radio-frequency signals) input into the amplifier elements in the power amplifiers are detected to vary the amplitude level of the power supply voltage of the amplifier elements in accordance with the envelopes. Use of the ET method enables loss in power to be reduced, compared with a case in which the power supply voltage has a constant amplitude level, to realize high efficiency.

For purposes of this disclosure, the ET method includes an analog envelope tracking method (hereinafter referred to as an "analog ET method") and a digital envelope tracking method (hereinafter referred to as a "digital ET method").

In an exemplary aspect, the analog ET method is a method in which the envelopes of the amplitudes of transmission signals (e.g., radio-frequency signals) input into the amplifier elements in the power amplifiers are continuously detected to vary the amplitude level of the power supply voltage of the amplitude elements in accordance with the envelopes that are continuously detected. Since the envelopes are continuously detected in the analog ET method, the amplitude level of the power supply voltage is continuously varied.

In an exemplary aspect, when the analog ET method is used in the first embodiment, the tracker module 1 continuously detects the envelope of the amplitude of the first transmission signal input into each of the multiple first power amplifiers 81 to supply the power supply voltage V1, the amplitude level of which is continuously varied in accordance with the envelope that is continuously detected, to the first power amplifier 81.

The digital ET method is a method in which the envelopes of the amplitudes of transmission signals (e.g., radio-frequency signals) input into amplifier elements in the power amplifiers are discretely detected to vary the amplitude level of the power supply voltage of the amplitude elements in accordance with the envelopes that are discretely detected. In the digital ET method, the amplitude levels of the transmission signals are detected not continuously but at regular intervals and the detected amplitude levels are quantized. Since the envelopes are discretely detected in the digital ET method, the amplitude level of the power supply voltage is discretely varied.

In an exemplary aspect, when the digital ET method is used in the first embodiment, the tracker module 1 discretely detects the envelope of the amplitude of the first transmission signal input into each of the multiple first power amplifiers 81 to supply the power supply voltage V1, the amplitude level of which is discretely varied in accordance with the envelope that is discretely detected, to the first power amplifier 81.

In the tracker module 1, the multiple external connection terminals 5 include multiple (e.g., four in the drawings) first output terminals 6, as illustrated in FIG. 1 and FIG. 3. The multiple first output terminals 6 correspond to the multiple first power amplifiers 81. Each first output terminal 6 is arranged on a second main surface 22 of the substrate 2 and is connected to the corresponding first power amplifier 81. Each first output terminal 6 is connected to the tracker component 3.

Among the multiple first output terminals 6, first output terminals 6A and 6D are overlapped with the tracker component 3 in a plan view from the thickness direction of the substrate 2, as illustrated in FIG. 1.

This configuration enables the first output terminals 6A and 6D connected to the first power amplifiers 81 to be connected to the tracker component 3 in an arrangement region of the tracker component 3. As a result, the wiring lengths between the first output terminals 6A and 6D connected to the first power amplifiers 81 and the tracker component 3 can be shortened.

(2) Respective Components in Tracker Module

The respective components in the tracker module 1 according to the first embodiment will now be described with reference to the drawings.

(2.1) Substrate

The substrate 2 illustrated in FIG. 1 and FIG. 2 is a substrate different from a substrate (not illustrated) on which the multiple first power amplifiers 81 are arranged. The substrate 2 has a first main surface 21 and the second main surface 22. The first main surface 21 is opposed to the second main surface 22 in the thickness direction of the substrate 2.

The substrate 2 is, for example, a low temperature co-fired ceramics (LTCC) substrate having a laminated structure of multiple dielectric layers, a high temperature co-fired ceramics (HTCC) substrate, a component-embedded board, a substrate including a redistribution layer (RDL), or a printed circuit board.

(2.2) Tracker Component

The tracker component 3 is arranged on the first main surface 21 of the substrate 2, as illustrated in FIG. 2 and FIG. 3, and generates the power supply voltage V1. The tracker component 3 is configured so as to supply the power supply voltage V1 to the multiple (e.g., four in the drawing) first power amplifiers 81. More specifically, the tracker component 3 generates the power supply voltage V1 of an amplitude level corresponding to the envelope of the amplitude of the first transmission signal and supplies the generated power supply voltage V1 to each first power amplifier 81.

The tracker component 3 has multiple (e.g., 36 in the drawing) terminals 31. The multiple terminals 31 include an input terminal through which a power supply control signal is input. The input terminal is connected to a signal processing circuit 92 (refer to FIG. 4) and the power supply control signal from the signal processing circuit 92 is input through the input terminal. The tracker component 3 generates the power supply voltage V1 based on the power supply control signal input through the input terminal. At this time, the tracker component 3 varies the amplitude of the power supply voltage V1 based on the power supply control signal from the signal processing circuit 92. In other words, the tracker component 3 performs envelope tracking to generate the power supply voltage V1, which is varied in accordance with the envelopes of the amplitudes of the radio-frequency signals supplied from the signal processing circuit 92.

The tracker component 3 supplies the power supply voltage V1 to the respective first power amplifiers 81 via the corresponding first output terminals 6 using the ET method.

The tracker component 3 is an integrated circuit, such as a semiconductor integrated circuit (IC), and is composed using, for example, complementary metal oxide semiconductor (CMOS). Specifically, the tracker component 3 is manufactured through a silicon on insulator (SOI) process. The tracker component 3 may be made of at least one of GaAs, SiGe, and GaN. The semiconductor material of the tracker component 3 is not limited to the above materials.

(2.3) External Connection Terminal

The multiple external connection terminals 5 include an input terminal 51, multiple (e.g., four in the drawing) control terminals 52, multiple sets (e.g., two sets in the drawing) of signal terminals 53, and the multiple (e.g., four in the drawing) first output terminals 6, as illustrated in FIG. 1. The multiple external connection terminals 5 are arranged in a grid pattern, for example, on the second main surface 22 of the substrate 2. In the example in FIG. 1, the multiple external connection terminals 5 are arranged in a 5×8 grid pattern.

The input terminal 51 is connected to, for example, the battery (not illustrated) of a terminal or the like in which the radio-frequency module 8 (refer to FIG. 4) is installed. The battery voltage, which is supplied from the battery to the tracker module 1, is input through the input terminal 51.

The multiple control terminals 52 are terminals which are connected to the signal processing circuit 92 (refer to FIG. 4) and through which the signals including the power supply control signal from the signal processing circuit 92 are input. The signal input through each control terminal 52 is supplied to the tracker component 3.

The multiple sets of signal terminals 53 are terminals through which envelope differential signals from the signal processing circuit 92 are input. The envelope differential signal input through each set of signal terminals 53 is supplied to the tracker component 3.

(2.4) First Output Terminal

The multiple first output terminals 6 are terminals which are connected to the corresponding multiple first power amplifiers 81 and through which the power supply voltage V1 is supplied from the tracker module 1 to the multiple first power amplifiers 81, as illustrated in FIG. 1 and FIG. 3. More specifically, the multiple first output terminals 6 have one-to-one correspondence to the multiple first power amplifiers 81 and each first output terminal 6 is a terminal through which the power supply voltage V1 output from the tracker component 3 is supplied to the corresponding first power amplifier 81, among the multiple first power amplifiers 81. The power supply voltage V1 output from the tracker component 3 passes through each first output terminal 6. In other words, each of the multiple first output terminals 6 is connected to the tracker component 3 and serves as a supply path of the power supply voltage V1 to be supplied to the corresponding first power amplifier 81, among the multiple first power amplifiers 81.

In the example in FIG. 3, the first output terminal 6A is a terminal through which the power supply voltage V1 is supplied to a first power amplifier 81A. A first output terminal 6B is a terminal through which the power supply voltage V1 is supplied to a first power amplifier 81B. A first output terminal 6C is a terminal through which the power supply voltage V1 is supplied to a first power amplifier 81C. The first output terminal 6D is a terminal through which the power supply voltage V1 is supplied to a first power amplifier 81D.

For purposes of this disclosure, the term "corresponding to" generally means the relationship between the first output terminal 6 through which the power supply voltage V1 from the tracker component 3 passes and the first power amplifier 81 that receives the power supply voltage V1. In the example in FIG. 3, the first output terminal 6A corresponds to the first power amplifier 81A, the first output terminal 6B corresponds to the first power amplifier 81B, the first output terminal 6C corresponds to the first power amplifier 81C, and the first output terminal 6D corresponds to the first power amplifier 81D. The "corresponding to" is not limited to the one-to-one correspondence.

The multiple first output terminals 6 are arranged on the second main surface 22 of the substrate 2, as illustrated in FIG. 1. Each first output terminal 6 is connected to the corresponding first power amplifier 81, as illustrated in FIG. 3. Each first output terminal 6 is connected to the tracker component 3. For purposes of this disclosure, the term "the first output terminal 6 is connected to the tracker component 3" includes both connection of the first output terminal 6 to the tracker component 3 via no element and connection of the first output terminal 6 to the tracker component 3 via another element. In other words, "the first output terminal 6 is connected to the tracker component 3" includes both direct connection of the first output terminal 6 to the tracker component 3 and indirect connection of the first output terminal 6 to the tracker component 3.

(2.5) Position of First Output Terminal

The multiple first output terminals 6 are arranged on the second main surface 22 of the substrate 2, as illustrated in FIG. 1. The first output terminals 6 are connected to the tracker component 3.

As illustrated in FIG. 1, the multiple first output terminals 6 are each arranged along the outermost periphery on the second main surface 22 of the substrate 2. In other words, the first output terminals 6 are arranged along the edges in the state in which the multiple external connection terminals 5 are arranged.

For purposes of this disclosure, the term "the first output terminals 6 are each arranged along the outermost periphery on the second main surface 22 of the substrate 2" means that the first output terminal 6 is arranged at a position where no external connection terminal exists between the first output terminal 6 and at least one side of the outer rim of the substrate 2 on the second main surface 22 of the substrate 2. In other words, "the first output terminals 6 are each arranged along the outermost periphery on the second main surface 22 of the substrate 2" means that the first output terminal 6 is arranged at a position where no external connection terminal exists between the first output terminal 6 and at least one side of the outer rim of the substrate 2 in a plan view from the thickness direction of the substrate 2. Yet further, "the first output terminals 6 are each arranged along the outermost periphery on the second main surface 22 of the substrate 2" means that the first output terminal 6 is arranged at a position where no external connection terminal exists between the first output terminal 6 and the outer rim of the substrate 2 in a direction orthogonal to the thickness direction of the substrate 2. For example, "the first output terminals 6 are each arranged along the outermost periphery on the second main surface 22 of the substrate 2" means that the first output terminal 6 is arranged at a position where no external connection terminal exists on a shortest straight line between the first output terminal 6 and the outer rim of the substrate 2.

Accordingly, the first output terminals 6 are easily connected to the first power amplifiers 81. More specifically, arranging the tracker module 1 so that the first output terminals 6 come close to the first power amplifiers 81 on a substrate (mother board) on which the tracker module 1 is mounted enables the wiring lengths between the first output terminals 6 and the first power amplifiers 81 to be shortened. As a result, a wiring pattern portion for connecting the first output terminals 6 to the first power amplifiers 81 is easily formed, compared with a case in which the first output terminals 6 are not arranged along the outermost periphery on the second main surface 22 of the substrate 2.

The multiple first output terminals 6 are arranged so as not to be adjacent to each other on the second main surface 22 of the substrate 2, as illustrated in FIG. 1. More specifically, the first output terminal 6A, the first output terminal 6B, the first output terminal 6C, and the first output terminal 6D are arranged so as not to adjacent to each other on the second main surface 22 of the substrate 2. According to an exemplary aspect, the external connection terminals 5 existing between the first output terminals 6 are ground terminals that are grounded.

Accordingly, since the distances between the multiple first output terminals 6 can be increased, isolation between the multiple first output terminals 6 can be improved as compared with a case in which the multiple first output terminals 6 are adjacent to each other.

For purposes of this disclosure, the term "the multiple first output terminals 6 are arranged so as not to be adjacent to each other" means that the first output terminals 6 are arranged so that at least one external connection terminal 5 exists between the first output terminals 6. Moreover, the term "at least one external connection terminal 5 exists between the first output terminals 6" means that at least one of multiple line segments connecting an arbitrary point in one of the first output terminals 6 to an arbitrary point in the other of the first output terminals 6 passes through at least part of the external connection terminal 5 in a plan view from the thickness direction of the substrate 2. For purposes of this disclosure, the plan view from the thickness direction of the substrate 2 means that the substrate 2 and electronic components mounted on the substrate 2 are orthogonally projected on a plane parallel to the main surfaces (i.e., the first main surface 21 and the second main surface 22) of the substrate 2 for viewing.

In the example in FIG. 1, since the four external connection terminals 5 exist between the first output terminal 6A and the first output terminal 6B, the first output terminal 6A and the first output terminal 6B are arranged so as not to be adjacent to each other. In addition, since the one external connection terminal 5 exists between the first output terminal 6B and the first output terminal 6C, the first output terminal 6B and the first output terminal 6C are arranged so as not to be adjacent to each other. Furthermore, since the four external connection terminals 5 exist between the first output terminal 6C and the first output terminal 6D, the first output terminal 6C and the first output terminal 6D are arranged so as not to be adjacent to each other.

Furthermore, at least two first output terminals 6, among the multiple first output terminals 6, are arranged along two different end edges of the substrate 2. In the example in FIG. 1, the first output terminal 6A is arranged along a lower edge (e.g., a first edge) of the substrate 2, the first output terminal 6B and the first output terminal 6C are arranged along a left edge (e.g., a second edge) of the substrate 2, and the first output terminal 6D is arranged along an upper edge (e.g., a third edge) of the substrate 2. Accordingly, the first output terminal 6A and the first output terminals 6B and 6C are arranged along the different end edges of the substrate 2. In addition, the first output terminals 6B and 6C and the first output terminal 6D are arranged along the different end edges of the substrate 2. Furthermore, the first output terminal 6A and the first output terminal 6D are arranged along the different end edges of the substrate 2.

In the first embodiment, the two end edges of the substrate 2, along which at least two first output terminals 6 are arranged, are opposed to each other. In the example in FIG. 1, the first output terminal 6A is arranged along the lower edge of the substrate 2 and the first output terminal 6D is arranged along the upper edge of the substrate 2. Accordingly, the first output terminals 6A and 6D are arranged along the two end edges of the substrate 2, which are opposed to each other.

As illustrated in FIG. 1, the first output terminals 6A and 6D, among the multiple first output terminals 6, are overlapped with the tracker component 3 in a plan view from the thickness direction of the substrate 2.

Accordingly, an output terminal (not illustrated) of the tracker component 3 is configured to be connected to the first output terminals 6A and 6D in the arrangement region of the tracker component 3. As a result, the wiring lengths between the first output terminals 6A and 6D connected to the first power amplifiers 81 and the tracker component 3 can be shortened as compared with a case in which the first output terminals connected to the first power amplifiers are not overlapped with the arrangement region of the tracker component. More specifically, the wiring length between the first output terminal 6A connected to the first power amplifier 81A and the tracker component 3 and the wiring length between the first output terminal 6D connected to the first power amplifier 81D and the tracker component 3 can be shortened.

(3) Respective Components in Radio-Frequency Module

The respective components in the radio-frequency module 8 according to the first embodiment will now be described with reference to the drawings.

Figure 5:
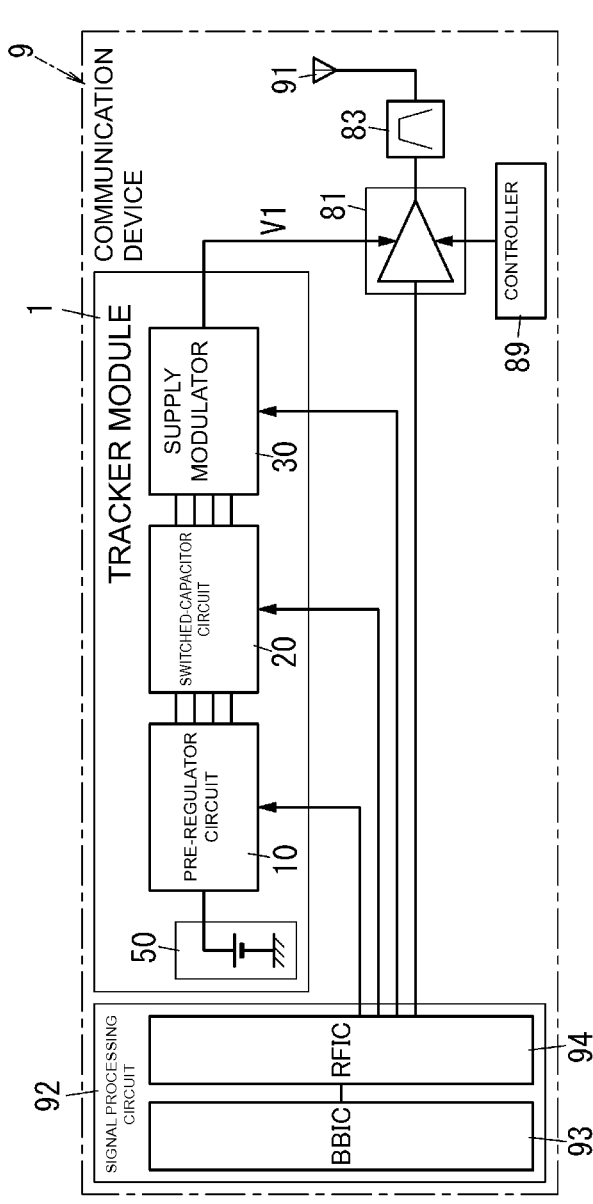
FIG. 5 is a conceptual diagram illustrating the configuration of the communication device in FIG. 4.

The radio-frequency module 8 includes the multiple first power amplifiers 81 (only two first power amplifiers 81 are illustrated in FIG. 4), multiple first transmission filters 83 and 84 (only two first transmission filters are illustrated in FIG. 4), first reception filters 851 and 852, first low noise amplifiers 861 and 862, a switch 87, multiple external connection terminals 88 (only seven external connection terminals 88 are illustrated in FIG. 4), and a controller 89, as illustrated in FIG. 4 and FIG. 5. The multiple external connection terminals 88 include signal input terminals 881 and 882, signal output terminals 883 and 884, an antenna terminal 885, and terminal 886 and 887.

The radio-frequency module 8 amplifies the power of the radio-frequency signal (RF signal) output from a radio-frequency (RF) signal processing circuit 94 described below to a level necessary for transmission to a base station (not illustrated) and outputs the amplified radio-frequency signal.
(3.1) Power Amplifier The first power amplifiers 81 illustrates in FIG. 4 each include a transistor (an amplifier element). The transistor of the first power amplifier 81 is, for example, an NPN transistor and is an amplifier element that amplifies the radio-frequency signal in response to application of the power supply voltage V1. The transistor amplifies the radio-frequency signal output from the RF signal processing circuit 94. The collector of the transistor is electrically connected to the first output terminal 6 of the tracker module 1 via the terminal 886. The emitter of the transistor has ground potential.

The power supply voltage V1 is applied to the transistor of the first power amplifier 81. The radio-frequency signal output from the RF signal processing circuit 94 is supplied to the base of the transistor. The tracker module 1 is connected to the collector of the transistor. The power supply voltage V1, which is controlled in accordance with the amplitude level of the radio-frequency signal, is applied from the tracker module 1 to the collector of the transistor. The collector of the transistor is connected to the first transmission filter 83.

Since the ET method is used, as described above, the amplitude level of the power supply voltage V1 is varied based on the variation in the amplitude of the radio-frequency signal.

Here, the first power amplifier 81 is a power amplifier that amplifies the FDD transmission signal. More specifically, the first power amplifier 81 is a power amplifier that amplifies the transmission signal the communication band of which is a middle band. The first power amplifier 81 is, for example, a power amplifier supporting Band30. Since the first power amplifier 81 is a power amplifier for the FDD, a reception operation is also performed when the first power amplifier 81 operates in response to the power supply voltage V1 and a transmission operation is performed in the radio-frequency module 8. Accordingly, the power supply voltage V1 preferably has a small harmonic-wave component (e.g., noise component) in the exemplary aspect.

Since the ET method is used in an exemplary aspect as described above, the amplitude level of the power supply voltage V1 can be varied based on the variation in the amplitude of the radio-frequency signal.
(3.2) Transmission Filter The first transmission filter 83 is a transmission filter of a communication band in which the radio-frequency signal is transmitted, as illustrated in FIG. 4. The first transmission filter 83 is provided on a path between the first power amplifier 81A and the antenna terminal 885, among transmission paths. More specifically, the first transmission filter 83 is provided on a path between the first power amplifier 81A and the switch 87. The first transmission filter 83 transmits the radio-frequency signal the power of which is amplified by the first power amplifier 81A and which is output from the first power amplifier 81A. The transmission path is a path connecting the signal input terminal 881 to the antenna terminal 885 to transmit the radio-frequency signal from an antenna 91. The first transmission filter 84 is a transmission filter of a communication band in which the radio-frequency signal is transmitted, as illustrated in FIG. 4. The first transmission filter 84 is provided on a path between the first power amplifier 81B and the antenna terminal 885, among the transmission paths. More specifically, the first transmission filter 84 is provided on a path between the first power amplifier 81B and the switch 87. The first transmission filter 84 transmits the radio-frequency signal the power of which is amplified by the first power amplifier 81B and which is output from the first power amplifier 81B. The transmission path is a path connecting the signal input terminal 882 to the antenna terminal 885 to transmit the radio-frequency signal from the antenna 91.

The filter transmitting the radio-frequency signal output from the first power amplifier 81A is not limited to the transmission filter, such as the first transmission filter 83, and may be a duplexer including both the transmission filter and the reception filter or a multiplexer including three or more filters.

The filter transmitting the radio-frequency signal output from the first power amplifier 81B is not limited to the transmission filter, such as the first transmission filter 84, and may be a duplexer including both the transmission filter and the reception filter or a multiplexer including three or more filters.

(3.3) Switch

The switch 87 is a switch that switches the path to be connected to the antenna terminal 885, as illustrated in FIG. 4. In other words, the switch 87 is a switch that switches the filter to be connected to the antenna terminal 885, in the multiple filters including the first transmission filter 83, the first transmission filter 84, the first reception filter 851, and the first reception filter 852.

The switch 87 is, for example, a switch integrated circuit (IC). The switch 87 is controlled by, for example, the signal processing circuit 92 described below. The switch 87 switches the connection state in accordance with a control signal from the RF signal processing circuit 94 in the signal processing circuit 92.

(3.4) Antenna Terminal

The antenna terminal 885 is a terminal to which the antenna 91 described below is connected, as illustrated in FIG. 4. The radio-frequency signal from the radio-frequency module 8 is supplied to the antenna 91 through the antenna terminal 885. In addition, the radio-frequency signal from the antenna 91 is supplied to the radio-frequency module 8 through the antenna terminal 885.

(3.5) Controller

The controller 89 illustrated in FIG. 5 is a power amplifier (PA) control circuit that controls the first power amplifiers 81. The controller 89 controls the magnitude and the supply timing of bias current (or bias voltage) to be supplied to the first power amplifiers 81 upon reception of the control signal from the RF signal processing circuit 94.

(4) Communication Device

The communication device 9 using the tracker module 1 will now be described with reference to the drawings.

The communication device 9 includes the tracker module 1, the radio-frequency module 8, the antenna 91, and the signal processing circuit 92, as illustrated in FIG. 4.

(4.1) Antenna

The antenna 91 is connected to the antenna terminal 885 of the radio-frequency module 8, as illustrated in FIG. 4. The antenna 91 has a radiation function to radiate the radio-frequency signal (i.e., the transmission signal) output from the radio-frequency module 8 as radio waves and a reception function to receive the radio-frequency signal (i.e., the reception signal) from the outside as the radio waves to supply the received radio-frequency signal (i.e., the reception signal) to the radio-frequency module 8.

(4.2) Signal Processing Circuit

The signal processing circuit 92 includes a baseband signal processing circuit 93 and the RF signal processing circuit 94, as illustrated in FIG. 4. The signal processing circuit 92 supplies the radio-frequency signal to the radio-frequency module 8. In other words, the signal processing circuit 92 supplies the transmission signal to the first power amplifiers 81A and 81B.

The baseband signal processing circuit 93 is, for example, a baseband integrated circuit (BBIC) and performs signal processing for the radio-frequency signal. The frequency of the radio-frequency signal is, for example, about several hundreds of megahertz to about several gigahertz.

The baseband signal processing circuit 93 generates an I-phase signal and a Q-phase signal from a baseband signal. The baseband signal is, for example, an audio signal, an image signal, or the like, that is externally input. The baseband signal processing circuit 93 combines the I-phase signal with the Q-phase signal to perform IQ modulation and outputs the transmission signal. At this time, the transmission signal is generated as a modulation signal (an IQ signal) resulting from amplitude modulation of a carrier signal of a predetermined frequency with a period longer than the period of the carrier signal. The modulation signal output from the baseband signal processing circuit 93 is output as the IQ signal. The IQ signal is a signal the amplitude and the phase of which is represented on an IQ plane. The frequency of the IQ signal is, for example, about several megahertz to about several tens of megahertz.

The RF signal processing circuit 94 is, for example, a radio-frequency integrated circuit (RFIC) and performs signal processing for the radio-frequency signal. The RF signal processing circuit 94 performs, for example, certain signal processing for the modulation signal (i.e., the IQ signal) output from the baseband signal processing circuit 93. More specifically, the RF signal processing circuit 94 performs signal processing, such as up-conversion, for the modulation signal output from the baseband signal processing circuit 93 and supplies the radio-frequency signal subjected to the signal processing to the radio-frequency module 8. The RF signal processing circuit 94 does not limitedly perform direct conversion from the modulation signal to the radio-frequency signal. The RF signal processing circuit 94 may convert the modulation signal to an intermediate frequency ("IF") signal to generate the radio-frequency signal from the IF signal subjected to the conversion.

The signal processing circuit 92 supplies the power supply control signal to the tracker component 3 in the tracker module 1. The power supply control signal is a signal including information about the variation in the amplitude of the radio-frequency signal and is supplied from the signal processing circuit 92 to the tracker module 1 in order to vary the amplitude of the power supply voltage V1. The power supply control signal is, for example, the I-phase signal and the Q-phase signal.

(5) Detailed Description of Tracker Module

Next, the tracker module 1 according to the first embodiment will be described in detail with reference to FIG. 5 and FIG. 6.

Figure 6:
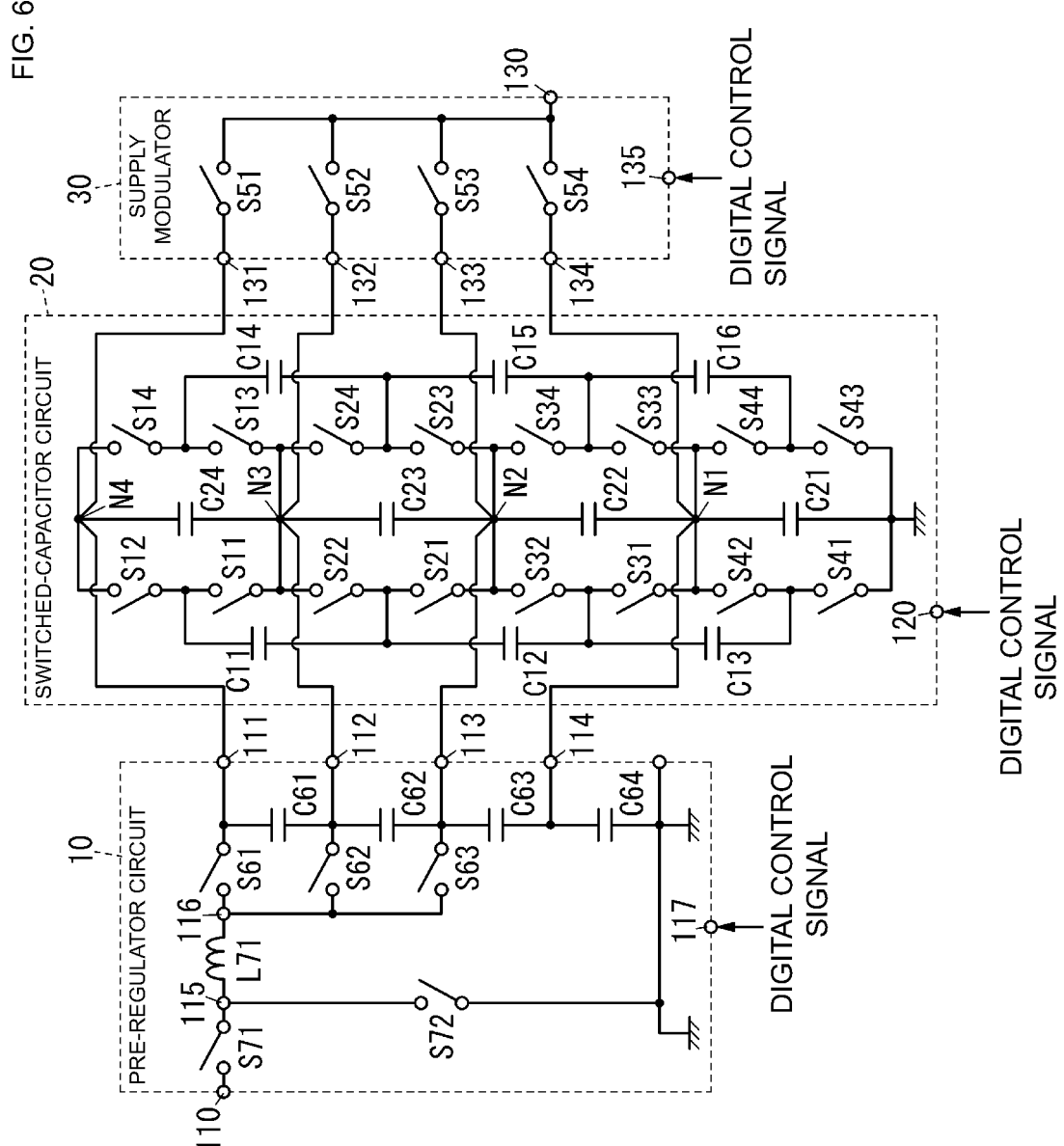
FIG. 6 is a conceptual diagram illustrating a configuration of a tracker component in the tracker module in FIG. 1.

The tracker module 1 includes a pre-regulator circuit 10, a switched-capacitor circuit 20, a supply modulator 30, and a direct current power source 50, as illustrated in FIG. 5 and FIG. 6.

The tracker module 1 supplies the power supply voltage V1 having a power supply voltage level, which is selected from multiple discrete voltage levels based an envelope signal, to the first power amplifier 81.

The pre-regulator circuit 10 includes a power inductor and switches. The power inductor is an inductor used for step-up and/or step-down of direct-current voltage (voltage step-up, voltage step-down, or voltage step-up and step-down). The power inductor is arranged in series on a direct-current path. The pre-regulator circuit 10 converts the voltage using the power inductor. The pre-regulator circuit 10 described above may be called a magnetic regulator or a direct-current (DC)-DC converter. The power inductor may be connected (e.g., arranged in parallel) between a series path and the ground.

The pre-regulator circuit 10 does not necessarily include the power inductor and may be, for example, a circuit or the like that performs the voltage step-up and/or the voltage step-down (the voltage step-up, the voltage step-down, or the voltage step-up and step-down) through switching between capacitors arranged on a series-arm path and a parallel-arm path of the pre-regulator circuit 10.

The switched-capacitor circuit 20 includes multiple capacitors and multiple switches and is configured to generate multiple voltages having multiple discrete voltage levels from the voltage output from the pre-regulator circuit 10. The switched-capacitor circuit 20 may be called a switched-capacitor voltage balancer.

The supply modulator 30 selects at least one voltage from the multiple voltages generated by the switched-capacitor circuit 20 based on a digital control signal corresponding to the envelope signal and supplies the selected voltage to the first power amplifier 81.

The direct current power source 50 supplies the direct-current voltage to the pre-regulator circuit 10. Although, for example, a rechargeable battery is used as the direct current power source 50, the direct current power source 50 is not limited to the rechargeable battery.

The tracker module 1 does not necessarily include at least one of the pre-regulator circuit 10 and the direct current power source 50. For example, the tracker module 1 does not necessarily include the direct current power source 50. In addition, an arbitrary combination of the pre-regulator circuit 10, the switched-capacitor circuit 20, and the supply modulator 30 may be integrated into a single circuit. An exemplary detailed circuit configuration of the tracker module 1 will be described below with reference to FIG. 6.

(5.1) Circuit Configuration of Tracker Module

Next, a circuit configuration of the pre-regulator circuit 10, the switched-capacitor circuit 20, and the supply modulator 30 included in the tracker module 1 will be described with reference to FIG. 6.

FIG. 6 illustrates an exemplary circuit configuration. The pre-regulator circuit 10, the switched-capacitor circuit 20, and the supply modulator 30 can be mounted using any of a wide variety of circuit mountings and circuit techniques. Accordingly, it should be appreciated that the description of each circuit described below should not be limitedly interpreted.

(5.2) Switched-Capacitor Circuit

The switched-capacitor circuit 20 includes multiple (e.g., six in the drawing) capacitors C11 to C16, multiple (e.g., four in the drawing) capacitors C21 to C24, multiple (e.g., 16 in the drawing) switches S11 to S14, S21 to S24, S31 to S34, and S41 to S44, and a control terminal 120, as illustrated in FIG. 6.

The control terminal 120 is an input terminal of the digital control signal. In other words, the control terminal 120 is a terminal for receiving the digital control signal to control the switched-capacitor circuit 20. The digital control signal received through the control terminal 120 is, for example, a source-synchronous control signal in which a data signal and a clock signal are transmitted. The digital control signal is not limited to the source-synchronous control signal. For example, the digital control signal may be a clock-embedded control signal.

Each of the multiple capacitors C11 to C16 functions as a flying capacitor (transfer capacitor). In other words, each of the multiple capacitors C11 to C16 is used to step up or step down the voltage supplied from the pre-regulator circuit 10. More specifically, the multiple capacitors C11 to C16 move electric charge between the capacitors C11 to C16 and nodes N1 to N4 so that voltages V11 to V14 (voltages with respect to the ground potential) meeting V11:V12:V13: V14=1:2:3:4 are maintained at the four nodes N1 to N4. The multiple voltages V11 to V14 correspond to the multiple voltages having the multiple discrete voltage levels. The voltage V11 is the voltage at the node N1, the voltage V12 is the voltage at the node N2, the voltage V13 is the voltage at the node N3, and the voltage V14 is the voltage at the node N4.

The capacitor C11 has two electrodes (a first electrode and a second electrode). One (the first electrode) of the two electrodes of the capacitor C11 is connected to one end (a first end) of the switch S11 and one end (a first end) of the switch S12. The other (the second electrode) of the two electrodes of the capacitor C11 is connected to one end (a first end) of the switch S21 and one end (a first end) of the switch S22.

The capacitor C12 has two electrodes (a first electrode and a second electrode). One (the first electrode) of the two electrodes of the capacitor C12 is connected to one end (the first end) of the switch S21 and one end (the first end) of the switch S22. The other (the second electrode) of the two electrodes of the capacitor C12 is connected to one end (a first end) of the switch S31 and one end (a first end) of the switch S32.

The capacitor C13 has two electrodes (a first electrode and a second electrode). One (the first electrode) of the two electrodes of the capacitor C13 is connected to one end (the first end) of the switch S31 and one end (the first end) of the switch S32. The other (the second electrode) of the two electrodes of the capacitor C13 is connected to one end (a first end) of the switch S41 and one end (a first end) of the switch S42.

The capacitor C14 has two electrodes (a first electrode and a second electrode). One (the first electrode) of the two electrodes of the capacitor C14 is connected to one end (a first end) of the switch S13 and one end (a first end) of the switch S14. The other (the second electrode) of the two electrodes of the capacitor C14 is connected to one end (a first end) of the switch S23 and one end (a first end) of the switch S24.

The capacitor C15 has two electrodes (a first electrode and a second electrode). One (the first electrode) of the two electrodes of the capacitor C15 is connected to one end (the first end) of the switch S23 and one end (the first end) of the switch S24. The other (the second electrode) of the two electrodes of the capacitor C15 is connected to one end (a first end) of the switch S33 and one end (a first end) of the switch S34.

The capacitor C16 has two electrodes (a first electrode and a second electrode). One (the first electrode) of the two electrodes of the capacitor C16 is connected to one end (the first end) of the switch S33 and one end (the first end) of the switch S34. The other (the second electrode) of the two electrodes of the capacitor C16 is connected to one end (a first end) of the switch S43 and one end (a first end) of the switch S44.

Each of the set of the capacitors C11 and C14, the set of the capacitors C12 and C15, and the set of the capacitors C13 and C16 is configured for complementarily performing charge and discharge through repetition of a first phase and a second phase described below.

Specifically, in the first phase, the switches S12, S13, S22, S23, S32, S33, S42, and S43 are turned on. Accordingly, for example, one (the first electrode) of the two electrodes of the capacitor C12 is connected to the node N3, the other (the second electrode) of the two electrodes of the capacitor C12 and one (the first electrode) of the two electrodes of the capacitor C15 are connected to the node N2, and the other (the second electrode) of the two electrodes of the capacitor C15 is connected to the node N1.

In contrast, in the second phase, the switches S11, S14, S21, S24, S31, S34, S41, and S44 are turned on. Accordingly, for example, one (the first electrode) of the two electrodes of the capacitor C15 is connected to the node N3, the other (the second electrode) of the two electrodes of the capacitor C15 and one (the first electrode) of the two electrodes of the capacitor C12 are connected to the node N2, and the other (the second electrode) of the two electrodes of the capacitor C12 is connected to the node N1.

Repeating the first phase and the second phase described above enables, for example, one of the capacitors C12 and C15 to discharge to the capacitor C23 while the other of the capacitors C12 and C15 is charged through the node N2. In other words, the capacitors C12 and C15 are configured for complementarily performing the charge and the discharge. The capacitors C12 and C15 are a pair of flying capacitors complementarily performing the charge and the discharge.

A set of any of the capacitors C11 to C13 and any of the capacitors C14 to C16 also serves as a pair of flying capacitors appropriately switching the switches to complementarily perform the charge through the node and the discharge to a smoothing capacitor, as in the set of the capacitors C12 and C15.

Each of the multiple capacitors C21 to C24 functions a smoothing capacitor. In other words, the capacitors C21 to C24 are used for holding and smoothing the voltages V11 to V14 at the nodes N1 to N4, respectively.

The capacitor C21 is connected between the node N1 and the ground. Specifically, one (a first electrode) of the two electrodes of the capacitor C21 is connected to the node N1. In contrast, the other (a second electrode) of the two electrodes of the capacitor C21 is grounded.

The capacitor C22 is connected between the node N2 and the node N1. Specifically, one (a first electrode) of the two electrodes of the capacitor C22 is connected to the node N2. In contrast, the other (a second electrode) of the two electrodes of the capacitor C22 is connected to the node N1.

The capacitor C23 is connected between the node N3 and the node N2. Specifically, one (a first electrode) of the two electrodes of the capacitor C23 is connected to the node N3. In contrast, the other (a second electrode) of the two electrodes of the capacitor C23 is connected to the node N2.

The capacitor C24 is connected between the node N4 and the node N3. Specifically, one (a first electrode) of the two electrodes of the capacitor C24 is connected to the node N4. In contrast, the other (a second electrode) of the two electrodes of the capacitor C24 is connected to the node N3.

The switch S11 is connected between one (the first electrode) of the two electrodes of the capacitor C11 and the node N3. Specifically, one end (the first end) of the switch S11 is connected to one of the two electrodes of the capacitor C11. In contrast, the other end (the second end) of the switch S11 is connected to the node N3.

The switch S12 is connected between one (the first electrode) of the two electrodes of the capacitor C11 and the node N4. Specifically, one end (the first end) of the switch S12 is connected to one of the two electrodes of the capacitor C11. In contrast, the other end (the second end) of the switch S12 is connected to the node N4.

The switch S21 is connected between one (the first electrode) of the two electrodes of the capacitor C12 and the node N2. Specifically, one end (the first end) of the switch S21 is connected to one of the two electrodes of the capacitor C12 and the other (the second electrode) of the two electrodes of the capacitor C11. In contrast, the other end (the second end) of the switch S21 is connected to the node N2.

The switch S22 is connected between one (the first electrode) of the two electrodes of the capacitor C12 and the node N3. Specifically, one end (the first end) of the switch S22 is connected to one of the two electrodes of the capacitor C12 and the other (the second electrode) of the two electrodes of the capacitor C11. In contrast, the other end (the second end) of the switch S22 is connected to the node N3.

The switch S31 is connected between the other (the second electrode) of the two electrodes of the capacitor C12 and the node N1. Specifically, one end (the first end) of the switch S31 is connected to the other of the two electrodes of the capacitor C12 and one (the first electrode) of the two electrodes of the capacitor C13. In contrast, the other end (the second end) of the switch S31 is connected to the node N1.

The switch S32 is connected between the other (the second electrode) of the two electrodes of the capacitor C12 and the node N2. Specifically, one end (the first end) of the switch S32 is connected to the other of the two electrodes of the capacitor C12 and one (the first electrode) of the two electrodes of the capacitor C13. In contrast, the other end (the second end) of the switch S32 is connected to the node N2. In other words, the other end of the switch S32 is connected to the other end (the second end) of the switch S21.

The switch S41 is connected between the other (the second electrode) of the two electrodes of the capacitor C13 and the ground. Specifically, one end (the first end) of the switch S41 is connected to the other (the second electrode) of the two electrodes of the capacitor C13. In contrast, the other end (the second end) of the switch S41 is grounded.

The switch S42 is connected between the other (the second electrode) of the two electrodes of the capacitor C13 and the node N1. Specifically, one end (the first end) of the switch S42 is connected to the other (the second electrode) of the two electrodes of the capacitor C13. In contrast, the other end (the second end) of the switch S42 is connected to the node N1. In other words, the other end of the switch S42 is connected to the other end (the second end) of the switch S31.

The switch S13 is connected between one (the first electrode) of the two electrodes of the capacitor C14 and the node N3. Specifically, one end (the first end) of the switch S13 is connected to one (the first electrode) of the two electrodes of the capacitor C14. In contrast, the other end (the second end) of the switch S13 is connected to the node N3. In other words, the other end of the switch S13 is connected to the other end (the second end) of the switch S11 and the other end (the second end) of the switch S22.

The switch S14 is connected between one (the first electrode) of the two electrodes of the capacitor C14 and the node N4. Specifically, one end (the first end) of the switch S14 is connected to one (the first electrode) of the two electrodes of the capacitor C14. In contrast, the other end (the second end) of the switch S14 is connected to the node N4. In other words, the other end of the switch S14 is connected to the other end (the second end) of the switch S12.

The switch S23 is connected between one (the first electrode) of the two electrodes of the capacitor C15 and the node N2. Specifically, one end (the first end) of the switch S23 is connected to one (the first electrode) of the two electrodes of the capacitor C15 and the other (the second electrode) of the two electrodes of the capacitor C14. In contrast, the other end (the second end) of the switch S23 is connected to the node N2. In other words, the other end of the switch S23 is connected to the other end (the second end) of the switch S21 and the other end (the second end) of the switch S32.

The switch S24 is connected between one (the first electrode) of the two electrodes of the capacitor C15 and the node N3. Specifically, one end (the first end) of the switch S24 is connected to one (the first electrode) of the two electrodes of the capacitor C15 and the other (the second electrode) of the two electrodes of the capacitor C14. In contrast, the other end (the second end) of the switch S24 is connected to the node N3. In other words, the other end of the switch S24 is connected to the other end (the second end) of the switch S11, the other end (the second end) of the switch S22, and the other end (the second end) of the switch S13.

The switch S33 is connected between the other (the second electrode) of the two electrodes of the capacitor C15 and the node N1. Specifically, one end (the first end) of the switch S33 is connected to the other (the second electrode) of the two electrodes of the capacitor C15 and one (the first electrode) of the two electrodes of the capacitor C16. In contrast, the other end (the second end) of the switch S33 is connected to the node N1. In other words, the other end of the switch S33 is connected to the other end (the second end) of the switch S31 and the other end (the second end) of the switch S42.

The switch S34 is connected between the other (the second electrode) of the two electrodes of the capacitor C15 and the node N2. Specifically, one end (the first end) of the switch S34 is connected to the other (the second electrode) of the two electrodes of the capacitor C15 and one (the first electrode) of the two electrodes of the capacitor C16. In contrast, the other end (the second end) of the switch S34 is connected to the node N2. In other words, the other end of the switch S34 is connected to the other end (the second end) of the switch S21, the other end (the second end) of the switch S32, and the other end (the second end) of the switch S23.

The switch S43 is connected between the other (the second electrode) of the two electrodes of the capacitor C16 and the ground. Specifically, one end (the first end) of the switch S43 is connected to the other (the second electrode) of the two electrodes of the capacitor C16. In contrast, the other end (the second end) of the switch S43 is grounded.

The switch S44 is connected between the other (the second electrode) of the two electrodes of the capacitor C16 and the node N1. Specifically, one end (the first end) of the switch S44 is connected to the other (the second electrode) of the two electrodes of the capacitor C16. In contrast, the other end (the second end) of the switch S44 is connected to the node N1. In other words, the other end of the switch S44 is connected to the other end (the second end) of the switch S31, the other end (the second end) of the switch S42, and the other end (the second end) of the switch S33.

Turning-on and turning-off of the first set of switches including the switches S12, S13, S22, S23, S32, S33, S42, and S43 and the second set of switches including the switches S11, S14, S21, S24, S31, S34, S41, and S44 are complementarily switched. Specifically, in the first phase, the first set of switches is turned on and the second set of switches is turned off. In contrast, in the second phase, the first set of switches is turned off and the second set of switches is turned on.

For example, the charge from the capacitors C11 to C13 to the capacitors C21 to C24 is performed in one of the first phase and the second phase, and the charge from the capacitors C14 to C16 to the capacitors C21 to C24 is performed in the other of the first phase and the second phase. In other words, the capacitors C21 to C24 are constantly charged from the capacitors C11 to C13 or the capacitors C14 to C16. Accordingly, since the electric charge is supplied to the nodes N1 to N4 at high speed even when current flows from the nodes N1 to N4 to the supply modulator 30 at high speed, variation in potential at the nodes N1 to N4 can be suppressed.

The switched-capacitor circuit 20 is configured to maintain approximately the same voltage at both ends of each of the capacitors C21 to C24 through the above operation. Specifically, the voltages V11 to V14 (voltages with respect to the ground potential) meeting V11:V12:V13:V14=1:2:3:4 are maintained at the four nodes N1 to N4, respectively. The voltage levels of the voltages V11 to V14 correspond to the multiple discrete voltage levels to be supplied to from the switched-capacitor circuit 20 to the supply modulator 30.

The voltage ratio V11:V12:V13:V14 is not limited to 1:2:3:4. For example, the voltage ratio V11:V12:V13:V14 may be 1:2:4:8.

The configuration of the switched-capacitor circuit 20 illustrated in FIG. 6 is only an example and the configuration of the switched-capacitor circuit 20 is not limited to the configuration illustrated in FIG. 6. Although the switched-capacitor circuit 20 is configured for supplying the voltages of the four discrete voltage levels in FIG. 6, the switched-capacitor circuit 20 is not limitedly configured to supply the voltages of the four discrete voltage levels. The switched-capacitor circuit 20 may be configured so as to be capable of supplying the voltages of an arbitrary number of two or more discrete voltage levels. For example, when the voltages of the two discrete voltage levels are supplied, it is sufficient for the switched-capacitor circuit 20 to include at least the capacitors C12 and C15 and the switches S21, S22, S31, S32, S23, S24, S33, and S34.

The switches included in the switched-capacitor circuit 20 are included in the tracker component 3 (refer to FIG. 3). Specifically, the tracker component 3 includes the multiple switches S11 to S14, S21 to S24, S31 to S34, and S41 to S44.

(5.3) Supply Modulator

Next, a circuit configuration of the supply modulator 30 will be described. The supply modulator 30 includes multiple (e.g., four in the drawing) input terminals 131 to 134, multiple (e.g., four in the drawing) switches S51 to S54, an output terminal 130, and a control terminal 135, as illustrated in FIG. 6.

The output terminal 130 is connected to the first power amplifier 81 (refer to FIG. 4). The output terminal 130 is a terminal for supplying the voltage selected from the voltages V11 to V14 to the first power amplifier 81.

The multiple input terminals 131 to 134 are connected to the nodes N1 to N4, respectively, of the switched-capacitor circuit 20. The multiple input terminals 131 to 134 are terminals for receiving the voltages V11 to V14, respectively, from the switched-capacitor circuit 20.

The control terminal 135 is an input terminal of the digital control signal. In other words, the control terminal 135 is a terminal for receiving the digital control signal, which indicates one of the voltages V11 to V14. The supply modulator 30 controls turning-on and turning-off of the multiple switches S51 to S54 so as to select the voltage level indicated by the digital control signal.

The digital control signal received through the control terminal 135 is, for example, two digital control logic/line (DCL) signals. Each of the two DCL signals is a one-bit signal. One of the voltages V11 to V14 is indicated by a combination of two one-bit signals. For example, the voltages V1, V12, V13, and V14 are indicated by "00", "01", "10", and "11", respectively. The voltage levels may be represented using gray codes. In the above case, two control terminals are provided to receive the two DCL signals. An arbitrary number of one or more DCL signals may be used depending on the number of the voltage levels. The DCL signal may be a two-or-more-bit signal. In addition, the digital control signal may be one or more DCL signals or may be a source-synchronous control signal.

The switch S51 is connected between the input terminal 131 and the output terminal 130. Specifically, the switch S51 has a first terminal connected to the input terminal 131 and a second terminal connected to the output terminal 130. In the above configuration, the switch S51 switches between turning-on and turning-off to switch between connection and non-connection between the input terminal 131 and the output terminal 130.

The switch S52 is connected between the input terminal 132 and the output terminal 130. Specifically, the switch S52 has a first terminal connected to the input terminal 132 and a second terminal connected to the output terminal 130. In the above configuration, the switch S52 switches between turning-on and turning-off to switch between connection and non-connection between the input terminal 132 and the output terminal 130.

The switch S53 is connected between the input terminal 133 and the output terminal 130. Specifically, the switch S53 has a first terminal connected to the input terminal 133 and a second terminal connected to the output terminal 130. In the above configuration, the switch S53 switches between turning-on and turning-off to switch between connection and non-connection between the input terminal 133 and the output terminal 130.

The switch S54 is connected between the input terminal 134 and the output terminal 130. Specifically, the switch S54 has a first terminal connected to the input terminal 134 and a second terminal connected to the output terminal 130. In the above configuration, the switch S54 switches between turning-on and turning-off to switch between connection and non-connection between the input terminal 134 and the output terminal 130.

The multiple switches S51 to S54 are controlled so as to be exclusively turned on. In other words, only one of the switches S51 to S54 is turned on and the remaining switches of the switches S51 to S54 are turned off. This enables the supply modulator 30 to output one voltage selected from the voltages V11 to V14.

The supply modulator 30, which has the above configuration, receives the digital control signal corresponding to the envelope signal through the control terminal 135 and controls turning-on and turning-off of the multiple switches S51 to S54 based on the digital control signal input through the control terminal 135 to select at least one of the multiple voltages V11 to V14 generated in the switched-capacitor circuit 20. The supply modulator 30 outputs the selected voltage.

The configuration of the supply modulator 30 illustrated in FIG. 6 is only an example and the configuration of the supply modulator 30 is not limited to the configuration illustrated in FIG. 6. In particular, it is sufficient for each of the switches S51 to S54 to select any of the four input terminals 131 to 134 to be connected to the output terminal 130, and the supply modulator 30 may have any configuration. For example, the supply modulator 30 may further include a switch connected between the switches S51 to S53, and the switch S54 and the output terminal 130. For example, the supply modulator 30 may further include a switch connected between the switches S51 and S52, and the switches S53 and S54 and the output terminal 130.

For example, when one voltage is selected from second voltages having two discrete voltage levels, it is sufficient for the supply modulator 30 to at least include the switches S52 and S53.

The supply modulator 30 may be configured to output two or more voltages. In the above case, it is sufficient for the supply modulator 30 to further include a required number of additional switch sets, which are similar to the set of the switches S51 to S54, and additional output terminals.

The switches included in the supply modulator 30 are included in the tracker component 3 (refer to FIG. 3). Specifically, the tracker component 3 includes the multiple switches S51 to S54.

(5.4) Pre-Regulator Circuit

Next, a circuit configuration of the pre-regulator circuit 10 will be described. The pre-regulator circuit 10 includes an input terminal 110, multiple (e.g., four in the drawing) output terminals 111 to 114, multiple inductor connection terminals 115 and 116, a control terminal 117, multiple (e.g., five in the drawing) switches S61, S62, S63, S71, and S72, a power inductor L71, and multiple capacitors C61, C62, C63, and C64, as illustrated in FIG. 6.

The input terminal 110 is an input terminal of the direct-current voltage. In other words, the input terminal 110 is a terminal for receiving input voltage from the direct current power source 50 (refer to FIG. 5).

The output terminal 111 is an output terminal of the voltage V14. In other words, the output terminal 111 is a terminal for supplying the voltage V14 to the switched-capacitor circuit 20. The output terminal 111 is connected to the node N4 of the switched-capacitor circuit 20.

The output terminal 112 is an output terminal of the voltage V13. In other words, the output terminal 112 is a terminal for supplying the voltage V13 to the switched-capacitor circuit 20. The output terminal 112 is connected to the node N3 of the switched-capacitor circuit 20.

The output terminal 113 is an output terminal of the voltage V12. In other words, the output terminal 113 is a terminal for supplying the voltage V12 to the switched-capacitor circuit 20. The output terminal 113 is connected to the node N2 of the switched-capacitor circuit 20.

The output terminal 114 is an output terminal of the voltage V11. In other words, the output terminal 114 is a terminal for supplying the voltage V11 to the switched-capacitor circuit 20. The output terminal 114 is connected to the node N1 of the switched-capacitor circuit 20.

The inductor connection terminal 115 is connected to one end (a first end) of the power inductor L71. The inductor connection terminal 116 is connected to the other end (a second end) of the power inductor L71.

The control terminal 117 is an input terminal of the digital control signal. In other words, the control terminal 117 is a terminal for receiving the digital control signal to control the pre-regulator circuit 10.

The switch S71 is connected between the input terminal 110 and one end (the first end) of the power inductor L71. Specifically, the switch S71 has a first terminal connected to the input terminal 110 and a second terminal connected to one end of the power inductor L71 via the inductor connection terminal 115. With the above configuration, the switch S71 switches between turning-on and the turning-off to switch between connection and non-connection between the input terminal 110 and one end of the power inductor L71.

The switch S72 is connected between one end (the first end) of the power inductor L71 and the ground. Specifically, the switch S72 has a first terminal connected to one end of the power inductor L71 via the inductor connection terminal 115 and a second terminal that is grounded. With the above configuration, the switch S72 switches between turning-on and the turning-off to switch between connection and non-connection between one end of the power inductor L71 and the ground.

The switch S61 is connected between the other end (the second end) of the power inductor L71 and the output terminal 111. Specifically, the switch S61 has a first terminal connected to the other end of the power inductor L71 and a second terminal connected to the output terminal 111. With the above configuration, the switch S61 switches between turning-on and the turning-off to switch between connection and non-connection between the other end of the power inductor L71 and the output terminal 111.

The switch S62 is connected between the other end (the second end) of the power inductor L71 and the output terminal 112. Specifically, the switch S62 has a first terminal connected to the other end of the power inductor L71 and a second terminal connected to the output terminal 112. With the above configuration, the switch S62 switches between turning-on and the turning-off to switch between connection and non-connection between the other end of the power inductor L71 and the output terminal 112.

The switch S63 is connected between the other end (the second end) of the power inductor L71 and the output terminal 113. Specifically, the switch S63 has a first terminal connected to the other end of the power inductor L71 and a second terminal connected to the output terminal 113. With the above configuration, the switch S63 switches between turning-on and the turning-off to switch between connection and non-connection between the other end of the power inductor L71 and the output terminal 113.

The capacitor C61 is connected between the output terminal 111 and the output terminal 112. One (a first electrode) of the two electrodes of the capacitor C61 is connected to the switch S61 and the output terminal 111, and the other (a second electrode) of the two electrodes of the capacitor C61 is connected to the switch S62, the output terminal 112, and one (a first electrode) of the two electrodes of the capacitor C62.

The capacitor C62 is connected between the output terminal 112 and the output terminal 113. One (the first electrode) of the two electrodes of the capacitor C62 is connected to the switch S62, the output terminal 112, and the other (the second electrode) of the two electrodes of the capacitor C61, and the other (a second electrode) of the two electrodes of the capacitor C62 is connected to the switch S63, the output terminal 113, and one of the two electrodes of the capacitor C63.

The capacitor C63 is connected between the output terminal 113 and the output terminal 114. One (a first electrode) of the two electrodes of the capacitor C63 is connected to the switch S63, the output terminal 113, and the other (the second electrode) of the two electrodes of the capacitor C62, and the other (a second electrode) of the two electrodes of the capacitor C63 is connected to the output terminal 114 and one (a first electrode) of the two electrodes of the capacitor C64.

The capacitor C64 is connected between the output terminal 114 and the ground. One (the first electrode) of the two electrodes of the capacitor C64 is connected to the output terminal 114 and the other (the second electrode) of the two electrodes of the capacitor C63, and the other (a second electrode) of the two electrodes of the capacitor C64 is grounded.

According to an exemplary aspect, the multiple switches S61 to S63 are controlled so as to be exclusively turned on. In other words, only one of the switches S61 to S63 is turned on and the remaining switches of the switches S61 to S63 are turned off. The voltage levels of the voltages V11 to V14 can be varied depending on which is turned on, among the switches S61 to S63.

The pre-regulator circuit 10 having the above configuration supplies the electric charge to the switched-capacitor circuit 20 via at least one of the multiple output terminals 111 to 113.

The switches included in the pre-regulator circuit 10 are installed in the tracker component 3 (refer to FIG. 3). Specifically, the tracker component 3 includes the multiple switches S61 to S63, S71, and S72.

(6) Operation of Tracker Module

Next, an operation of the tracker module 1 according to the first exemplary embodiment will be described with reference to FIG. 3. The communication band supported by the first power amplifier 81A to which the power supply voltage V1 is applied from the tracker component 3 is referred to as a first communication band, and the communication band supported by the first power amplifier 81B to which the power supply voltage V1 is applied from the tracker component 3 is referred to as a second communication band.

The tracker module 1 according to the first exemplary embodiment is configured for simultaneous communication by the two first power amplifiers 81. For example, the tracker module 1 configured for simultaneous communication by the first power amplifiers 81A and 81B. In this case, the tracker component 3 has a function to output the power supply voltage V1 through the first output terminals 6A and 6B.

The tracker component 3 outputs the power supply voltage V1. The tracker module 1 outputs the power supply voltage V1 through the first output terminals 6. The power supply voltage V1 is applied to the first power amplifiers 81A to 81D. Since the power supply voltage V1 does not pass through any filter (not illustrated), the relatively high-power supply voltage V1 is output through the first output terminals 6 of the tracker module 1.

A method of confirming whether the multiple first power amplifiers 81 are used for the simultaneous communication will now be described. First, the operation of the simultaneous communication is confirmed in the communication device 9 (i.e., the radio-frequency module 8). Next, it is confirmed whether the multiple first power amplifiers 81 are simultaneously operating after confirming the operation of the simultaneous communication. Then, it is confirmed whether all of the multiple first power amplifiers 81 that are simultaneously operating are connected to the tracker module 1 and are not connected to another tracker module (e.g., power supply). In this case, since the power supply voltage V1 is supplied from only one tracker module 1 to the multiple first power amplifiers 81 that are simultaneously operating, it is determined that the multiple first power amplifiers 81 are used for the simultaneous communication.

(7) Technical Advantages

In the tracker module 1 according to the first embodiment, the three or more first output terminals 6 are arranged along the outermost periphery on the second main surface 22 of the substrate 2. This facilitates leading from each first output terminal 6 on the substrate (the mother board or the like) on which the tracker module 1 is arranged. In other words, the wiring lengths between the first output terminals 6 connected to the first power amplifiers 81 and the first power amplifiers 81 can be shortened. In addition, a wiring layout between the first output terminals 6 connected to the first power amplifiers 81 and the first power amplifiers 81 is simplified.

In the tracker module 1 according to the first embodiment, the three or more first output terminals 6 are arranged so as not to be adjacent to each other on the second main surface 22 of the substrate 2. This improves the isolation between the first output terminals 6.

In the tracker module 1 according to the first embodiment, at least two first output terminals 6 are arranged along the two different end edges of the substrate 2. This enables the first output terminals 6 to be easily laid out in a wide range.

In the tracker module 1 according to the first embodiment, the two end edges of the substrate 2 are opposed to each other and at least two first output terminals 6 are arranged along the two end edges that are opposed to each other. This configuration improves the isolation between the first output terminals 6.

In the tracker module 1 according to the first embodiment, the first output terminals 6 (e.g., the first output terminals 6A and 6D in the example in FIG. 1) are overlapped with the tracker component 3 in a plan view from the thickness direction of the substrate 2. This enables the wiring lengths between the tracker component 3 and the first output terminals 6 to be shortened.

(8) Modifications

Modifications of the first embodiment will now be described.

(8.1) First Modification

As a first modification of the first embodiment, all of the multiple first output terminals 6 are not limitedly arranged along the outermost periphery on the second main surface 22 of the substrate 2. In other words, at least one of the multiple first output terminals 6 may be arranged at a position where another external connection terminal 5 exists between the first output terminal 6 and the outer rim of the substrate 2. In sum, it is sufficient for the three or more first output terminals 6 to be arranged along the outermost periphery on the second main surface 22 of the substrate 2.

(8.2) Second Modification

As a second modification of the first embodiment, the multiple first output terminals 6 are not limitedly arranged so as not to be adjacent to each other on the second main surface 22 of the substrate 2. Two or more of the multiple first output terminals 6 may be arranged so as to be adjacent to each other.

(8.3) Third Modification

As a third modification of the first embodiment, the multiple first output terminals 6 are not limitedly arranged along the two different end edges of the substrate 2. The multiple first output terminals 6 may be arranged along the same end edge of the substrate 2.

(8.4) Fourth Modification

As a fourth modification of the first embodiment, the multiple first output terminals 6 are not limitedly overlapped with the tracker component 3 in a plan view from the thickness direction of the substrate 2. In other words, the first output terminals 6 may be arranged at positions that are not overlapped with the tracker component 3 on the second main surface 22 of the substrate 2.

(8.5) Fifth Modification

As a fifth modification of the first embodiment, all of the multiple first output terminals 6 may be overlapped with the tracker component 3 in a plan view from the thickness direction of the substrate 2.

This enables the first output terminals 6 to be connected to the tracker component 3 in the arrangement region of the tracker component 3 for all of the multiple first output terminals 6. As a result, the wiring lengths between the first output terminals 6 and the tracker component 3 for all of the multiple first output terminals 6 can be shortened.

The same advantages as those of the tracker module 1 according to the first exemplary embodiment are achieved also in the tracker modules according to the respective modifications described above.

Second Exemplary Embodiment

Figure 7:
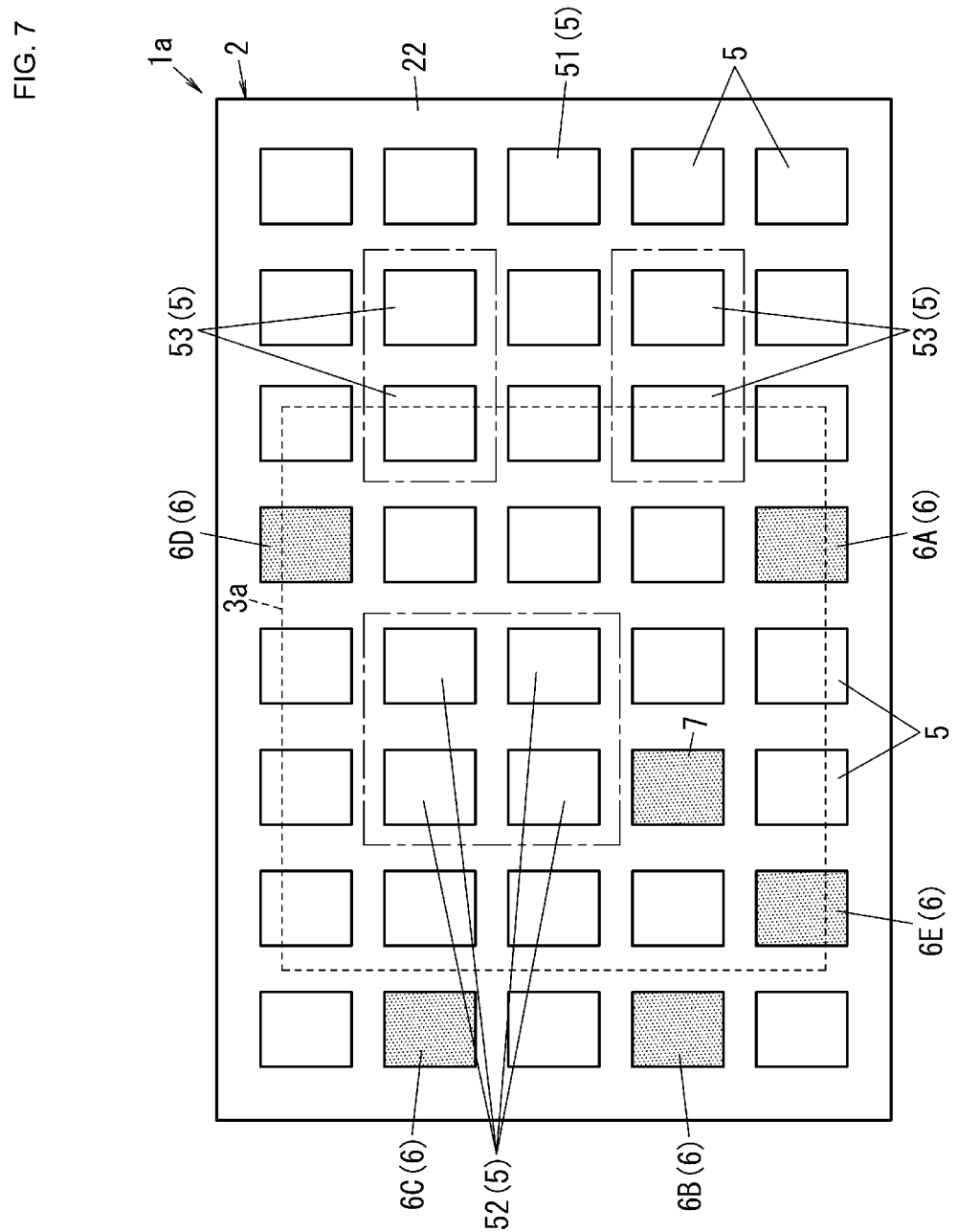
FIG. 7 is a perspective view of a tracker module according to a second exemplary embodiment.
Figure 8:
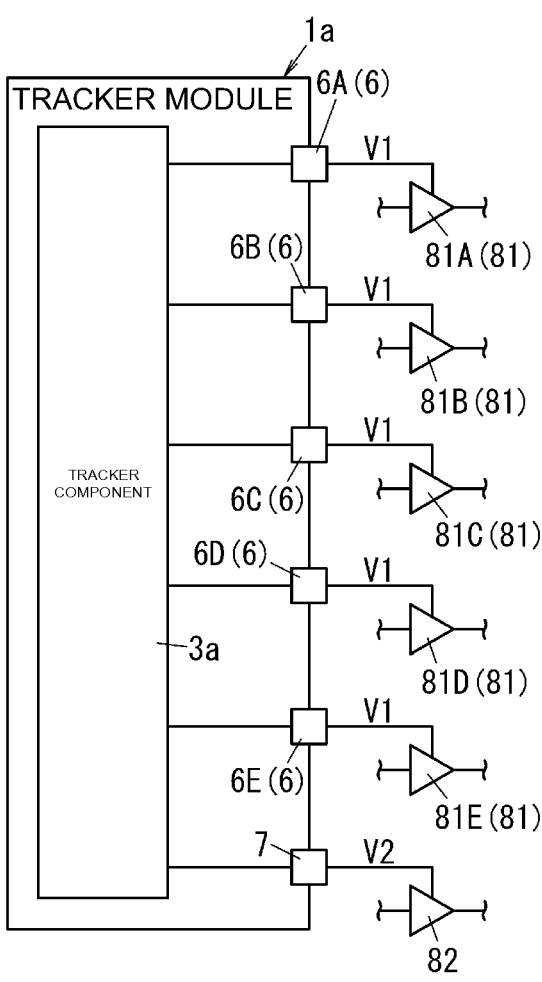
FIG. 8 is a block diagram illustrating a configuration of the tracker module in FIG. 7.

A tracker module 1a according to a second exemplary embodiment differs from the tracker module 1 (refer to FIG. 1) according to the first embodiment in that the tracker module 1a according to the second embodiment includes a second output terminal 7, as illustrated in FIG. 7 and FIG. 8. The same reference numerals and letters are added to the same components as in the tracker module 1 according to the first embodiment in the tracker module 1a according to the second embodiment and a description of such components is omitted herein.

Configuration

The tracker module 1a according to the second embodiment is configured so as to output the power supply voltage V1 to the multiple (e.g., five in the drawing) first power amplifiers 81, as illustrated in FIG. 8. In addition, the tracker module 1a is configured so as to output power supply voltage V2 to a second power amplifier 82. The second power amplifier 82 is configured so as to amplify a second transmission signal (e.g., a radio-frequency signal) upon application of the power supply voltage V2 to its amplifier element (not illustrated). The multiple first power amplifiers 81 and the second power amplifier 82 amplify transmission signals in different communication bands.

The tracker module 1a is used in the communication device 9 (refer to FIG. 4), like the tracker module 1 according to the first embodiment. More specifically, the tracker module 1a is used in the communication device 9 along with the multiple first power amplifiers 81 and the second power amplifier 82, which are included in the radio-frequency module 8 (refer to FIG. 4).

The tracker module 1a according to the second embodiment includes the substrate 2, a tracker component 3a, and the multiple (e.g., 40 in the drawing) external connection terminals 5, as illustrated in FIG. 7 and FIG. 8.

According to an exemplary aspect, the ET method is used when the first power amplifiers 81 and the second power amplifier 82 amplify the transmission signals using the power supply voltages V1 and V2 from the tracker module 1a.

Thus, when the analog ET method is used in the second exemplary embodiment, the tracker module 1a continuously detects the envelope of the amplitude of the first transmission signal input into each of the multiple first power amplifiers 81 to supply the power supply voltage V1, the amplitude level of which is continuously varied in accordance with the envelope that is continuously detected, to the first power amplifier 81. In addition, the tracker module 1a continuously detects the envelope of the amplitude of the second transmission signal input into second power amplifier 82 to supply the power supply voltage V2, the amplitude level of which is continuously varied in accordance with the envelope that is continuously detected, to the second power amplifier 82.

Moreover, when the digital ET method is used in the second embodiment, the tracker module 1a discretely detects the envelope of the amplitude of the first transmission signal input into each of the multiple first power amplifiers 81 to supply the power supply voltage V1, the amplitude level of which is discretely varied in accordance with the envelope that is discretely detected, to the first power amplifier 81. In addition, the tracker module 1a discretely detects the envelope of the amplitude of the second transmission signal input into the second power amplifier 82 to supply the power supply voltage V2, the amplitude level of which is discretely varied in accordance with the envelope that is discretely detected, to the second power amplifier 82.

The tracker module 1a includes the pre-regulator circuit 10 (refer to FIG. 6), the switched-capacitor circuit 20 (refer to FIG. 6), the supply modulator 30 (refer to FIG. 6), and the direct current power source 50 (refer to FIG. 5), as in the tracker module 1 according to the first embodiment.

Tracker Component

The tracker component 3a is arranged on the first main surface 21 (refer to FIG. 2) of the substrate 2, like the tracker component 3 according to the first embodiment, as illustrated in FIG. 7 and FIG. 8. The tracker component 3a generates the power supply voltages V1 and V2.

The tracker component 3a is configured so as to supply the power supply voltage V1 to the multiple (e.g., five in the drawing) first power amplifiers 81. For example, the tracker component 3a is configured to individually supply the power supply voltage V1 to the multiple first power amplifiers 81. More specifically, the tracker component 3a generates the power supply voltage V1 having the amplitude level corresponding to the envelope of the amplitude of the first transmission signal to supply the generated power supply voltage V1 to the first power amplifiers 81. In addition, the tracker component 3a is configured so as to supply the power supply voltage V2 to the second power amplifier 82. More specifically, the tracker component 3a generates the power supply voltage V2 having the amplitude level corresponding to the envelope of the amplitude of the second transmission signal to supply the generated power supply voltage V2 to the second power amplifier 82.

The tracker component 3a supplies the power supply voltage V1 to the first power amplifiers 81 via the first output terminals 6 using the ET method. The tracker component 3a supplies the power supply voltage V2 to the second power amplifier 82 via the second output terminal 7 using the ET method.

External Connection Terminal

The multiple external connection terminals 5 include the input terminal 51, the multiple (e.g., four in the drawing) control terminals 52, the multiple sets (e.g., two sets in the drawing) of signal terminals 53, the multiple (e.g., five in the drawing) first output terminals 6, and the second output terminal 7, as illustrated in FIG. 7. The multiple external connection terminals 5 are arranged in a grid pattern, for example, on the second main surface 22 of the substrate 2. In the example in FIG. 7, the multiple external connection terminals 5 are arranged in a 5×8 grid pattern.

First Output Terminal

The multiple first output terminals 6 are terminals through which the power supply voltage V1 from the tracker module 1a is supplied to the multiple first power amplifiers 81, as illustrated in FIG. 7 and FIG. 8. More specifically, the multiple first output terminals 6 have one-to-one correspondence to the multiple first power amplifiers 81, and each first output terminal 6 is a terminal through which the power supply voltage V1 output from the tracker component 3a is supplied to the corresponding first power amplifier 81. The power supply voltage V1 output from the tracker component 3a passes through each first output terminal 6.

In the example in FIG. 8, the first output terminal 6A is a terminal through which the power supply voltage V1 is supplied to the first power amplifier 81A. The first output terminal 6B is a terminal through which the power supply voltage V1 is supplied to the first power amplifier 81B. The first output terminal 6C is a terminal through which the power supply voltage V1 is supplied to the first power amplifier 81C. The first output terminal 6D is a terminal through which the power supply voltage V1 is supplied to the first power amplifier 81D. A first output terminal 6E is a terminal through which the power supply voltage V1 is supplied to a first power amplifier 81E.

As illustrated in FIG. 7, the first output terminals 6A, 6D, and 6E, among the multiple first output terminals 6, are overlapped with the tracker component 3a in a plan view from the thickness direction of the substrate 2.

Accordingly, an output terminal (not illustrated) of the tracker component 3a is configured to be connected to the first output terminals 6A, 6D, and 6E in an arrangement region of the tracker component 3a. As a result, the wiring lengths between the first output terminals 6A, 6D, and 6E connected to the first power amplifiers 81 and the tracker component 3a can be shortened. More specifically, the wiring length can be shortened between the first output terminal 6A connected to the first power amplifier 81A and the tracker component 3a, the wiring length between the first output terminal 6D connected to the first power amplifier 81D and the tracker component 3a, and the wiring length between the first output terminal 6E connected to the first power amplifier 81E and the tracker component 3a.

Also in the second embodiment, the multiple first output terminals 6 are each arranged along the outermost periphery on the second main surface 22 of the substrate 2, as in the first embodiment. In other words, the first output terminals 6 are arranged along the edges in the state in which the multiple external connection terminals 5 are arranged.

Accordingly, the first output terminals 6 are easily connected to the first power amplifiers 81. More specifically, arranging the tracker module 1a so that the first output terminals 6 come close to the first power amplifiers 81 on the substrate (the mother board) on which the tracker module 1a is mounted enables the wiring lengths between the first output terminals 6 and the first power amplifiers 81 to be shortened. As a result, a wiring pattern portion for connecting the first output terminals 6 to the first power amplifiers 81 is easily formed, compared with the case in which the first output terminals 6 are not arranged along the outermost periphery on the second main surface 22 of the substrate 2.

The multiple first output terminals 6 are arranged so as not to be adjacent to each other on the second main surface 22 of the substrate 2, as illustrated in FIG. 7. More specifically, the first output terminal 6A, the first output terminal 6B, the first output terminal 6C, the first output terminal 6D, and the first output terminal 6E are arranged so as not to adjacent to each other on the second main surface 22 of the substrate 2. In an exemplary aspect, the external connection terminals 5 existing between the first output terminals 6 are the ground terminals that are grounded.

Accordingly, since the distances between the multiple first output terminals 6 can be increased, the isolation between the multiple first output terminals 6 can be improved as compared with the case in which the multiple first output terminals 6 are adjacent to each other.

In the example in FIG. 7, since the two external connection terminals 5 exist between the first output terminal 6A and the first output terminal 6E, the first output terminal 6A and the first output terminal 6E are arranged so as not to be adjacent to each other. In addition, since the one external connection terminal 5 exists between the first output terminal 6B and the first output terminal 6C, the first output terminal 6B and the first output terminal 6C are arranged so as not to be adjacent to each other. Furthermore, since the one external connection terminal 5 exists between the first output terminal 6E and the first output terminal 6B, the first output terminal 6E and the first output terminal 6B are arranged so as not to be adjacent to each other.

Second Output Terminal

The second output terminal 7 illustrated in FIG. 7 is a terminal different the first output terminals 6 and is a terminal for supplying the power supply voltage V2 from the tracker module 1a to the second power amplifier 82. More specifically, the second output terminal 7 is a terminal for supplying the power supply voltage V2 output from the tracker component 3a to the second power amplifier 82. The power supply voltage V2 output from the tracker component 3a passes through the second output terminal 7.

The second output terminal 7 is arranged on the second main surface 22 of the substrate 2, as illustrated in FIG. 7. The second output terminal 7 is connected to the second power amplifier 82, as illustrated in FIG. 8. The second output terminal 7 is connected to the tracker component 3a. For purposes of this disclosure, the term "the second output terminal 7 is connected to the tracker component 3" includes both connection of the second output terminal 7 to the tracker component 3a via no element and connection of the second output terminal 7 to the tracker component 3a via another element. In other words, "the second output terminal 7 is connected to the tracker component 3a" includes both direct connection of the second output terminal 7 to the tracker component 3a and indirect connection of the second output terminal 7 to the tracker component 3a.

The second output terminal 7 is connected to the second power amplifier 82, among the multiple power amplifiers, and is arranged at a position different from the outermost periphery on the second main surface 22 of the substrate 2.

In addition, the second output terminal 7 is overlapped with the tracker component 3a in a plan view in the thickness direction of the substrate 2.

Accordingly, an output terminal (not illustrated) of the tracker component 3a is configured to be connected to second output terminal 7 in the arrangement region of the tracker component 3a. As a result, the wiring length between the second output terminal 7 connected to the second power amplifier 82 and the tracker component 3a can be shortened as compared with a case in which the second output terminal connected to the second power amplifier is not overlapped with the tracker component.

Maximum load current flowing through the second output terminal 7 is greater than the maximum load current flowing through each of the multiple first output terminals 6. Accordingly, high power supply power can be supplied to the second power amplifier 82 via the second output terminal 7.

A power class of the second power amplifier 82 connected to the second output terminal 7 is higher than the power class of each of the multiple first power amplifiers 81 connected to the multiple first output terminals 6. For example, the first power amplifiers 81 are power amplifiers supporting a non-high power class and the second power amplifier 82 is a power amplifier supporting a high-power class. Accordingly, the high-power supply power can be supplied to the second power amplifier 82 of the high power class.

For purposes of this disclosure, the term "power class" means the class of output power of a terminal, which is defined by maximum output power or the like. The power class having a lower value corresponds to the output of higher power. For example, power class 2 corresponds to the output of power higher than that of power class 3. The maximum output power of the high-power class is greater than the maximum output power of the non-high power class. The maximum output power is measured using, for example, a method defined by 3rd Generation Partnership Project (3GPP) or the like.

(2) Radio-Frequency Module

The second power amplifier 82 illustrated in FIG. 8 includes a transistor (an amplifier element). The transistor of the second power amplifier 82 is, for example, an NPN transistor and is an amplifier element that amplifies the radio-frequency signal in response to application of the power supply voltage V2. The transistor amplifies the radio-frequency signal output from the RF signal processing circuit 94. The collector of the transistor is electrically connected to the second output terminal 7 of the tracker module 1a. The emitter of the transistor has the ground potential.

The power supply voltage V2 is applied to the transistor of the second power amplifier 82. The radio-frequency signal output from the RF signal processing circuit 94 is supplied to the base of the transistor. The tracker module 1a is connected to the collector of the transistor. The power supply voltage V2, which is controlled in accordance with the amplitude level of the radio-frequency signal, is applied from the tracker module 1a to the collector of the transistor. The collector of the transistor is connected to a second transmission filter (not illustrated).

(3) Operation of Tracker Module

Next, an operation of the tracker module 1a according to the second embodiment will be described with reference to FIG. 8. The communication band supported by the first power amplifiers 81 to which the power supply voltage V1 is applied from the tracker component 3a is referred to as a first communication band, and the communication band supported by the second power amplifier 82 to which the power supply voltage V2 is applied from the tracker component 3a is referred to as a second communication band.

The tracker component 3a outputs the power supply voltage V1. The tracker module 1a outputs the power supply voltage V1 through the first output terminals 6. The power supply voltage V1 is applied to the first power amplifiers 81A to 81E. The tracker component 3a outputs the power supply voltage V2. The tracker module 1a outputs the power supply voltage V2 through the second output terminal 7. The power supply voltage V2 is applied to the second power amplifier 82.

(4) Technical Advantages

In the tracker module 1a according to the second embodiment, the maximum load current flowing through the second output terminal 7 is greater than the maximum load current flowing through the first output terminals 6. Accordingly, the high-power supply power can be supplied to the second power amplifier 82 through the second output terminal 7.

In the tracker module 1a according to the second embodiment, the power class of the second power amplifier 82 connected to the second output terminal 7 is higher than the power class of the first power amplifiers 81 connected to the first output terminals 6. Accordingly, the high-power supply power can be supplied to the second power amplifier 82 of the high power class.

In the tracker module 1a according to the second embodiment, the second output terminal 7 is overlapped with the tracker component 3a. Accordingly, the wiring length between the tracker component 3a and the second output terminal 7 can be shortened.

(5) Modifications

Modifications of the second embodiment will now be described.

(5.1) First Modification

As a first modification of the second embodiment, the second output terminal 7 is not limitedly overlapped with the tracker component 3a in a plan view from the thickness direction of the substrate 2. In other words, the second output terminal 7 may be arranged at a position that is not overlapped with the tracker component 3a on the second main surface 22 of the substrate 2.

(5.2) Second Modification

As a second modification of the second embodiment, the multiple external connection terminals 5 may include multiple second output terminals 7. In the second modification, all of the multiple second output terminals 7 may be overlapped with the tracker component 3a in a plan view from the thickness direction of the substrate 2 or only part of the multiple second output terminals 7 may be overlapped with the tracker component 3a in a plan view from the thickness direction of the substrate 2. When the two second output terminals 7 are provided, one of the two second output terminals 7 may be overlapped with the tracker component 3a and the other (the remaining one) of the two second output terminals 7 is not necessarily overlapped with the tracker component 3a. In sum, it is sufficient for at least one of the multiple second output terminals 7 to be overlapped with the tracker component 3a in a plan view from the thickness direction of the substrate 2. Alternatively, all of the multiple second output terminals 7 are not necessarily overlapped with the tracker component 3a in a plan view from the thickness direction of the substrate 2.

It should be appreciated that the same technical advantages as those of the tracker module 1a according to the second exemplary embodiment are achieved also in the tracker modules according to the respective modifications described above.

Third Exemplary Embodiment

A tracker module 1b according to a third exemplary embodiment differs from the tracker module 1a (refer to FIG. 7) according to the second embodiment in that the simultaneous communication by the three first power amplifiers 81 is enabled. The same reference numerals and letters are added to the same components as in the tracker module 1a according to the second embodiment in the tracker module 1b according to the third embodiment and a description of such components is omitted herein.

Configuration

Figure 9:
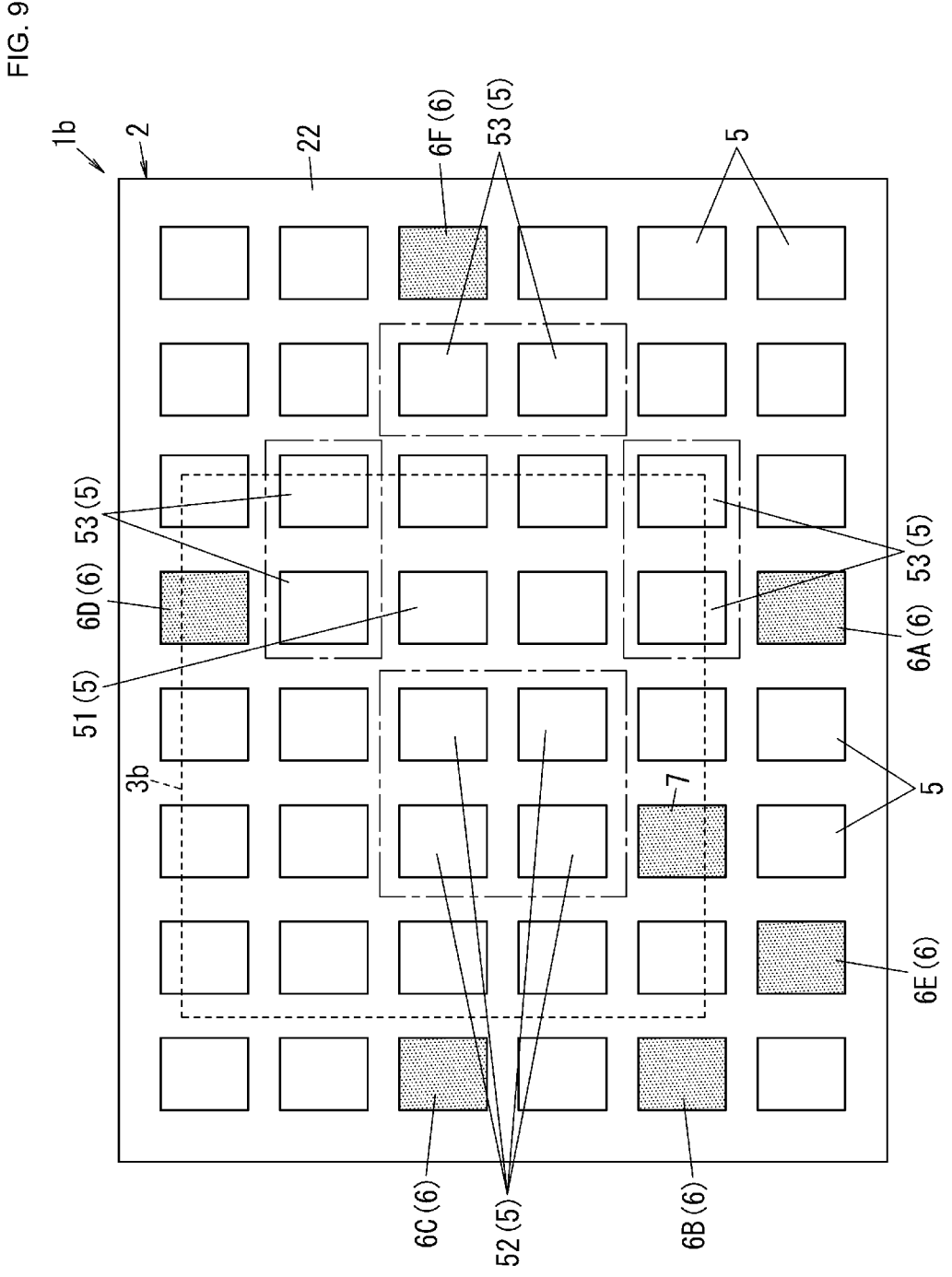
FIG. 9 is a perspective view of a tracker module according to a third exemplary embodiment.

The tracker module 1b according to the third embodiment includes the substrate 2, a tracker component 3b, and the multiple (48 in the example in the drawing) external connection terminals 5, as illustrated in FIG. 9, as in the tracker module 1a according to the second embodiment.

The multiple external connection terminals 5 include the input terminal 51, the multiple (e.g., four in the drawing) control terminals 52, the multiple sets (e.g., three sets in the drawing) of signal terminals 53, the multiple (e.g., six in the drawing) first output terminals 6, and the second output terminal 7, as illustrated in FIG. 9.

Figure 10:
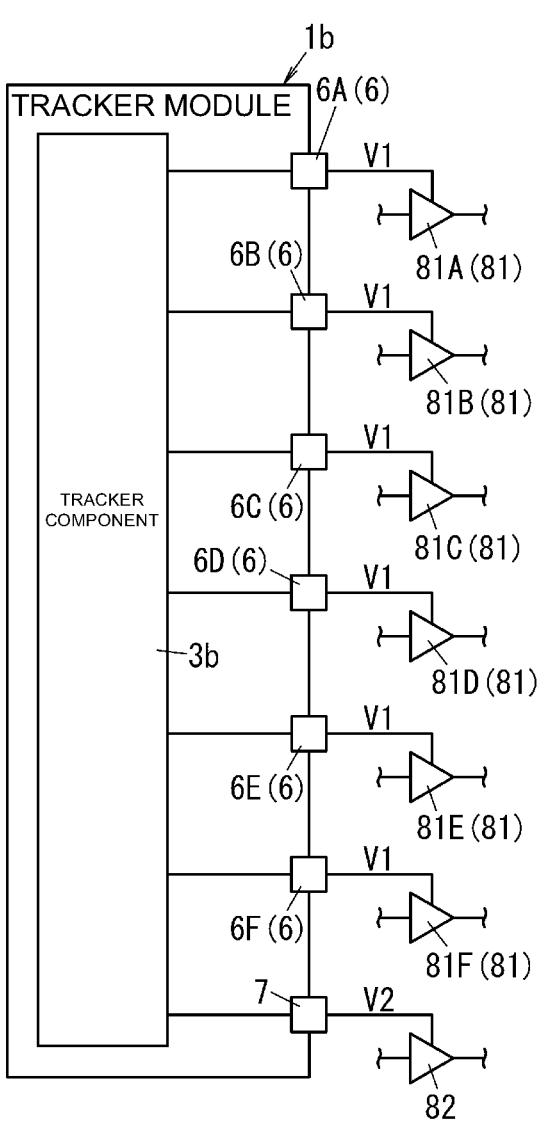
FIG. 10 is a block diagram illustrating a configuration of the tracker module in FIG. 9.

The tracker module 1b according to the third exemplary embodiment is configured for simultaneous communication by the three first power amplifiers 81, as illustrated in FIG. 9 and FIG. 10. For example, the tracker module 1b is configured for simultaneous communication by the first power amplifiers 81D, 81E, and 81F. In this case, the tracker component 3b has a function to output the power supply voltage V1 through the first output terminals 6D, 6E, and 6F.

In the third embodiment, the three sets of signal terminals 53 are provided in order to enable the simultaneous communication by the three first power amplifiers 81, as described above.

The second output terminal 7 is overlapped with the tracker component 3b in a plan view from the thickness direction of the substrate 2, as illustrated in FIG. 9.

Accordingly, an output terminal (not illustrated) of the tracker component 3b is configured to be connected to second output terminal 7 in the arrangement region of the tracker component 3b. As a result, the wiring length can further be shortened between the second output terminal 7 connected to the second power amplifier 82 and the tracker component 3b.

The tracker module 1b includes the pre-regulator circuit 10 (refer to FIG. 6), the switched-capacitor circuit 20 (refer to FIG. 6), the supply modulator 30 (refer to FIG. 6), and the direct current power source 50 (refer to FIG. 5), as in the tracker module 1a according to the second embodiment.

(2) Technical Advantages

In the tracker module 1b according to the third embodiment, the second output terminal 7 is overlapped with the tracker component 3b, as in the tracker module 1a according to the second embodiment. Accordingly, the wiring length between the tracker component 3b and the second output terminal 7 can be shortened.

In the tracker module 1b according to the third embodiment, the maximum load current flowing through the second output terminal 7 is greater than the maximum load current flowing through the first output terminals 6, as in the tracker module 1a according to the second embodiment. Accordingly, the high-power supply power can be supplied to the second power amplifier 82 through the second output terminal 7.

Fourth Exemplary Embodiment

Figure 11:
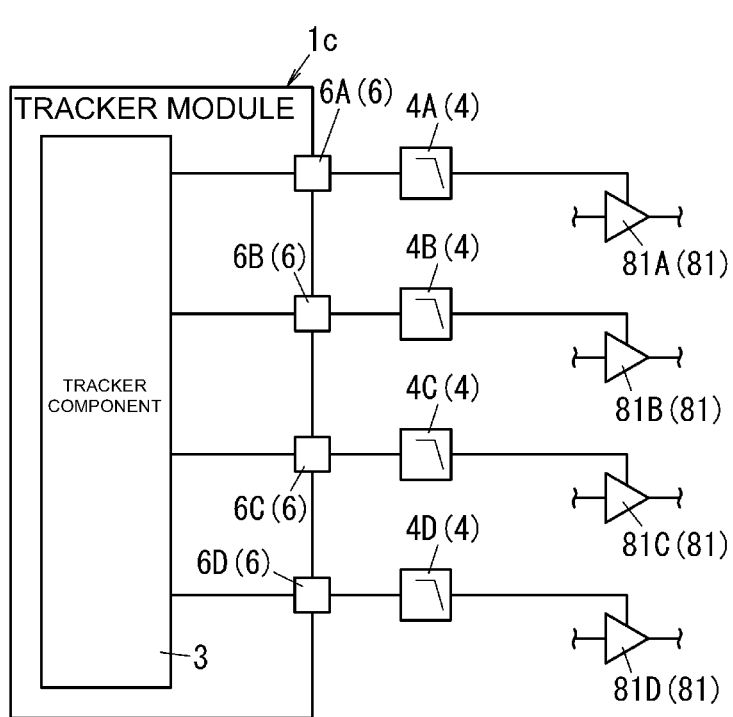
FIG. 11 is a block diagram illustrating a configuration of a tracker module according to a fourth exemplary embodiment.

A tracker module 1c according to a fourth exemplary embodiment differs from the tracker module 1 (refer to FIG. 3) according to the first embodiment in that the respective multiple first output terminals 6 are connected to the corresponding first power amplifiers 81 via filters 4, as illustrated in FIG. 11. The same reference numerals and letters are added to the same components as in the tracker module 1 according to the first embodiment in the tracker module 1c according to the fourth embodiment and a description of such components is omitted herein.
Configuration The tracker module 1c according to the fourth embodiment is connected to the multiple filters 4, as illustrated in FIG. 11. The tracker module 1c includes the substrate 2 (refer to FIG. 1), the tracker component 3, and the multiple external connection terminals 5 (refer to FIG. 1), as in the tracker module 1 according to the first embodiment. The multiple filters 4 are connected to the tracker module 1c.

The multiple first output terminals 6 have one-to-one correspondence to the multiple filters 4. The respective first output terminals 6 are connected to the corresponding first power amplifiers 81 via the corresponding filters 4.

(2) Filter

The multiple filters 4 are connected to the tracker module 1c, as illustrated in FIG. 11. Each filter 4 is connected to the tracker component 3 via the corresponding first output terminal 6. Each filter 4 reduces the harmonic-wave component of the power supply voltage V1. Accordingly, noise caused by the power supply voltage V1 is reduced.

Each filter 4 is, for example, a filter, which is a so-called an LC filter, including an inductor and a capacitor as main components. Each filter is, for example, a low pass filter. Moreover, the inductor is, for example, a chip inductor and the capacitor is, for example, a chip capacitor.

Each filter 4 is, for example, an L-shaped filter. As a first example, the inductor is provided on a path between the tracker component 3 and the first output terminal 6 and one end of the capacitor is connected to a path between the inductor and the first output terminal 6 to form the filter 4. As a second example, the inductor is provided on a path between the tracker component 3 and the first output terminal 6 and one end of the capacitor is connected to a path between the inductor and the tracker component 3 to form the filter 4.

The filter 4 transmits the power supply voltage V1 from the tracker component 3. Since the power supply voltage V1 is not sine-wave voltage, the filter 4 reduces the harmonic-wave component of the power supply voltage V1. In other words, the filter 4 cuts off the harmonic-wave component of the power supply voltage V1 and transmits a fundamental wave component of the power supply voltage V1. Then, the power supply voltage V1 passing through the filter 4 is applied to the first power amplifier 81. As a result, the power supply voltage V1 the harmonic-wave component of which is reduced is output from the filter 4.

(3) Detailed Description of Tracker Module

Next, the tracker module 1c according to the fourth embodiment will be described in detail with reference to FIG. 12 and FIG. 13.

Figure 12:
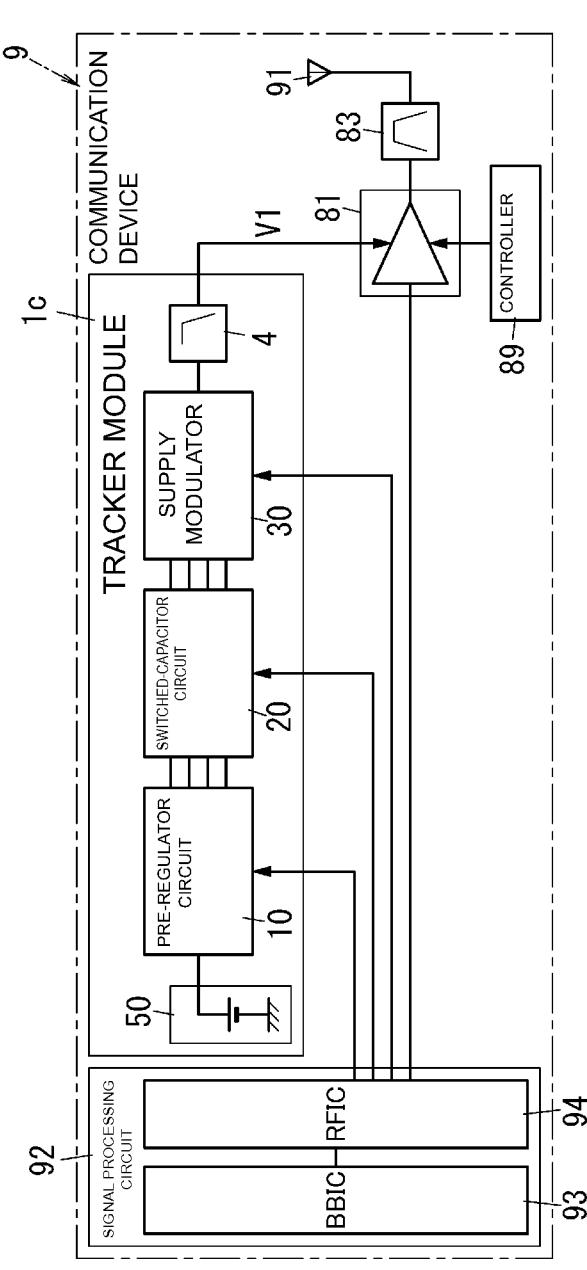
FIG. 12 is a conceptual diagram illustrating a configuration of a communication device according to the fourth exemplary embodiment.
Figure 13:
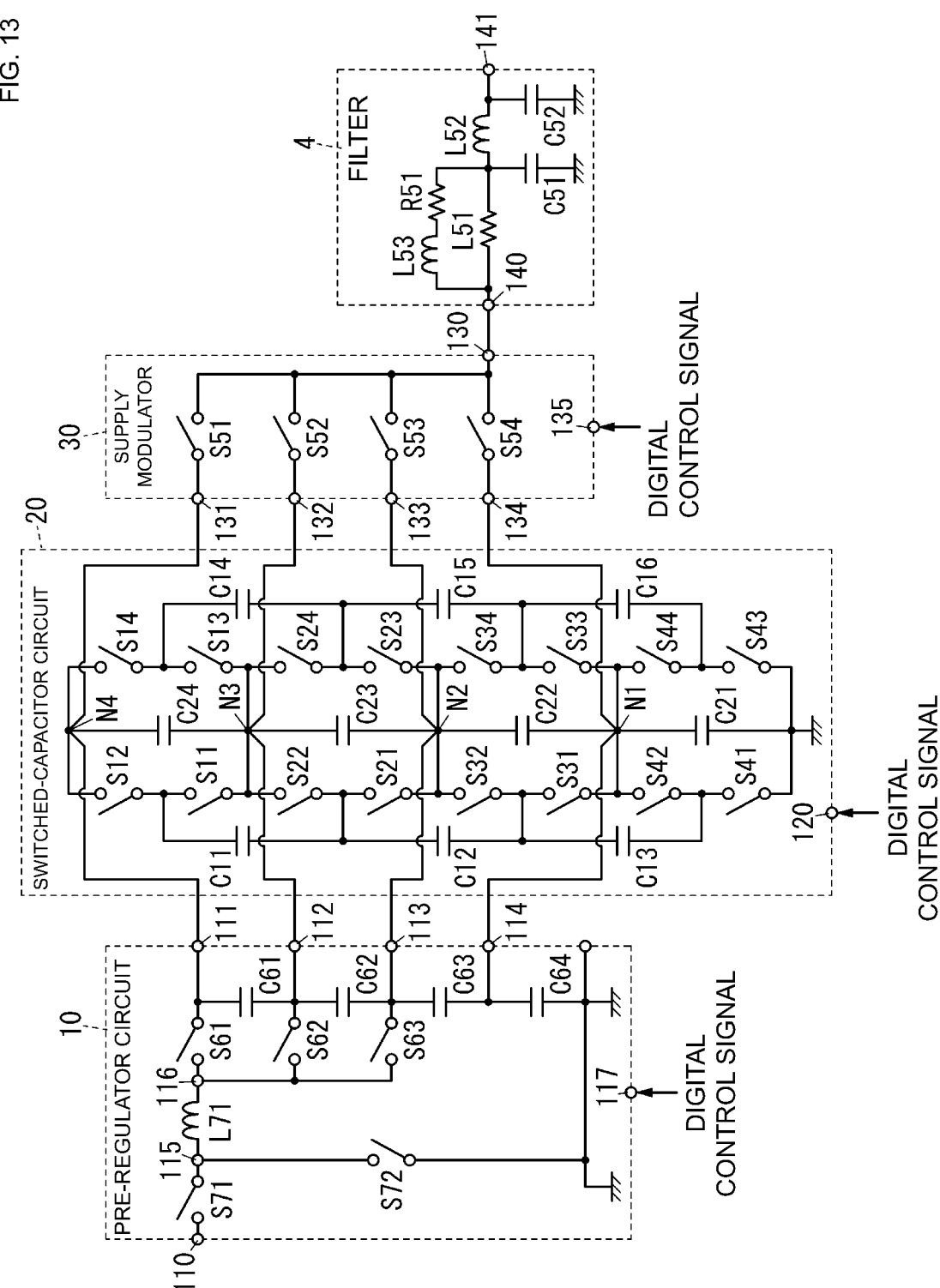
FIG. 13 is a conceptual diagram illustrating a configuration of a tracker component and a filter in the tracker module in FIG. 11.

The tracker module 1c includes the pre-regulator circuit 10, the switched-capacitor circuit 20, the supply modulator 30, the filter 4, and the direct current power source 50, as illustrated in FIG. 12 and FIG. 13.

The supply modulator 30 of the fourth embodiment selects at least one voltage from the multiple voltages generated by the switched-capacitor circuit 20 based on the digital control signal corresponding to the envelope signal and supplies the selected voltage to the filter 4.

The filter 4 performs filtering of the signal (e.g., a voltage) output from the supply modulator 30. The filter 4 includes, for example, a low pass filter (LPF).

The tracker module 1c does not necessarily include at least one of the pre-regulator circuit 10 and the direct current power source 50. For example, the tracker module 1c does not necessarily include the direct current power source 50. In addition, an arbitrary combination of the pre-regulator circuit 10, the switched-capacitor circuit 20, the supply modulator 30, and the filter 4 may be integrated into a single circuit. An exemplary detailed circuit configuration of the tracker module 1c will be described below with reference to FIG. 13.

(3.1) Circuit Configuration of Tracker Module

Next, a circuit configuration of the pre-regulator circuit 10, the switched-capacitor circuit 20, the supply modulator 30, and the filter 4 included in the tracker module 1c will be described with reference to FIG. 13.

FIG. 13 illustrates an exemplary circuit configuration. The pre-regulator circuit 10, the switched-capacitor circuit 20, the supply modulator 30, and the filter 4 may be mounted using any of a wide variety of circuit mountings and circuit techniques. Accordingly, it should be appreciated that the description of each circuit described below should not be limitedly interpreted.

(3.2) Switched-Capacitor Circuit

The switched-capacitor circuit 20 of the fourth embodiment includes the multiple (e.g., six in the drawing) capacitors C11 to C16, the multiple (e.g., four in the drawing) capacitors C21 to C24, the multiple (e.g., 16 in the drawing) switches S11 to S14, S21 to S24, S31 to S34, and S41 to S44, and the control terminal 120, as illustrated in FIG. 13, as in the switched-capacitor circuit 20 (refer to FIG. 6) of the first embodiment. Since the switched-capacitor circuit 20 according to the fourth embodiment has the same configuration and function as those of the switched-capacitor circuit 20 of the first embodiment, the same reference numerals and letters are added and a description of the switched-capacitor circuit 20 of the fourth embodiment is omitted herein.

(3.3) Supply Modulator

The supply modulator 30 of the fourth embodiment includes the multiple (e.g., four in the drawing) input terminals 131 to 134, the multiple (e.g., four in the drawing) switches S51 to S54, the output terminal 130, and the control terminal 135, as illustrated in FIG. 13, as in the supply modulator 30 (refer to FIG. 6) of the first embodiment. Since the supply modulator 30 according to the fourth embodiment has the same configuration and function as those of the supply modulator 30 of the first embodiment, the same reference numerals and letters are added and a description of the supply modulator 30 of the fourth embodiment is omitted herein.

(3.4) Pre-Regulator Circuit

The pre-regulator circuit 10 includes the input terminal 110, the multiple (e.g., four in the drawing) output terminals 111 to 114, the multiple inductor connection terminals 115 and 116, the control terminal 117, the multiple (e.g., five in the drawing) switches S61, S62, S63, S71, and S72, the power inductor L71, and the multiple capacitors C61, C62, C63, and C64, as illustrated in FIG. 13, as in the pre-regulator circuit 10 (refer to FIG. 6) of the first embodiment. Since the pre-regulator circuit 10 according to the fourth embodiment has the same configuration and function as those of the pre-regulator circuit 10 of the first embodiment, the same reference numerals and letters are added and a description of the pre-regulator circuit 10 of the fourth embodiment is omitted herein.

(3.5) Filter

Next, a circuit configuration of the filter 4 will be described. The filter 4 includes multiple (e.g., three in the drawing) inductors L51 to L53, multiple (e.g., two in the drawing) capacitors C51 and C52, a resistor R51, an input terminal 140, and an output terminal 141, as illustrated in FIG. 13.

The input terminal 140 is an input terminal of the voltage selected in the supply modulator 30. In other words, the input terminal 140 is a terminal for receiving the voltage selected from the multiple voltages V11 to V14.

The output terminal 141 is an output terminal of the power supply voltage V1. In other words, the output terminal 141 is a terminal for supplying the power supply voltage V1 to the first power amplifier 81.

The inductors L51 and L52 are connected in series between the input terminal 140 and the output terminal 141. A series connection circuit composed of the inductor L53 and the resistor R51 is connected in parallel to the inductor L51. The capacitor C51 is connected between a node between the inductor L51 and the inductor L52 and the ground. The capacitor C52 is connected between the output terminal 141 and the ground.

In the above configuration, the filter 4 composes an LC low pass filter in which the inductors L51 to L53 are arranged on a series-arm path and the capacitors C51 and C52 are arranged on a parallel-arm path. Accordingly, the filter 4 is configured to reduce the radio-frequency component included in the power supply voltage. For example, when a certain band is a frequency band for frequency division duplex (FDD), the filter 4 is configured so as to reduce the component of a downlink operation band of the certain band.

The configuration of the filter 4 illustrated in FIG. 13 is only an example and the filter 4 is not limited to the configuration illustrated in FIG. 13. The filter 4 may compose a band pass filter or a high pass filter depending on the band to be suppressed.

The filter 4 may include two or more LC filters. The two or more LC filters may be commonly connected to the output terminal 130 and the respective LC filters may have pass-bands or attenuation bands corresponding to different bands. Alternatively, a first filter group composed of two or more LC filters may be connected to the first output terminal of the supply modulator 30, a second filter group composed of other two or more LC filters may be connected to the second output terminal of the supply modulator 30, and the respective LC filters may have passbands or attenuation bands corresponding to different bands. In the above cases, the filter 4 may include two or more output terminals and two or more power supply voltages V1 may be simultaneously supplied to the different first power amplifiers 81.

(4) Technical Advantages

In the tracker module 1c according to the fourth embodiment, the respective three or more first output terminal 6 are connected to the corresponding first power amplifiers 81 via the filters 4. This enables noise component of the power supply voltage V1 to be supplied to the first power amplifiers 81 to be reduced.

(5) Modifications

Modifications of the fourth embodiment will now be described.

(5.1) First Modification

As a first modification of the fourth embodiment, each of the multiple filters 4 may be another LC filter, instead of the L-shaped filter. Each filter 4 may be a π-shaped filter or a T-shaped filter.

According to an exemplary aspect, when the filter 4 is the π-shaped filter, an inductor is provided on a path between the first output terminal 6 and the first power amplifier 81, one end of a first capacitor is connected to a path between the first output terminal 6 and the inductor, one end of a second capacitor is connected to a path between the inductor and the first power amplifier 81 to form the filter 4.

Moreover, according to an exemplary aspect, when the filter 4 is the T-shaped filter, a first inductor and a second inductor are provided so as to be connected in series on a path between the first output terminal 6 and the first power amplifier 81 and one end of a capacitor is connected to a path between the first inductor and the second inductor to form the filter 4. One end of a series circuit composed of the capacitor and a third inductor may be connected to a path between the first inductor and the second inductor.

(5.2) Second Modification

As a second modification of the fourth embodiment, each of the multiple filters 4 may be an element in which inductors and capacitors composing the filter 4 are packaged into one (one-packaged or a single package). This configuration reduces the arrangement area of each filter 4.

In the second modification of the fourth embodiment, the one-packaged filter is not limitedly used for all of the multiple filters 4 and the one-packaged filter may be used for at least one of the multiple filters 4. More specifically, the one-packaged filter may be used for at least one of the multiple filters 4 and filters that are not one-packaged may be used for the remaining filters of the multiple filters 4.

(5.3) Third Modification

As a third modification of the fourth embodiment, it is sufficient for the filter 4 to be a filter that cuts off the harmonic-wave component of the power supply voltage V1 and the filter 4 is not limited to the low pass filter.

(5.4) Fourth Modification

As a fourth modification of the fourth embodiment, the tracker module 1c may further include the second output terminal 7, as in the second and third embodiments. The second output terminal 7 may be connected to the second power amplifier 82 via a filter or may be connected to the second power amplifier 82 via no filter.

When the second output terminal 7 is connected to the second power amplifier 82 via no filter, the power supply voltage V2 from the tracker module 1c can be supplied to the second power amplifier 82 without attenuation by the filter.

In the case of the fourth modification, the power class of the second power amplifier 82 connected to the second output terminal 7 may be greater than the power class of each of the multiple first power amplifiers 81 connected to the multiple first output terminals 6. For example, the first power amplifier 81 is a power amplifier supporting the non-high power class and the second power amplifier 82 is a power amplifier supporting the high-power class.

Since the power supply voltage V2 output from the second output terminal 7 does not pass through the filter 4, as described above, the power supply voltage V2 can be supplied to the second power amplifier 82 without being influenced by the loss caused by the filter 4. This enables the high-power supply power to be supplied to the second power amplifier 82 of the high power class.

In the case of the fourth modification, each of the multiple first power amplifiers 81 connected to the multiple first output terminals 6 may be a power amplifier that amplifies the FDD transmission signal, and the second power amplifier 82 connected to the second output terminal 7 may be a power amplifier that amplifies the TDD transmission signal.

In the FDD communication, the reception operation is performed along with the transmission operation. Since the power supply voltage V1 is not sine waves, the harmonic-wave component is included in the power supply voltage V1. The harmonic-wave component of the power supply voltage V1 can be a noise component in the reception operation. For example, the harmonic-wave component of the power supply voltage V1 may be mixed with the transmission signal to cause the noise component of the frequency of the communication band of the reception signal.

In the fourth modification, the power supply voltage V1 is output from the tracker component 3, passes through the filters 4, and is supplied to the first power amplifiers 81. This enables the noise component of the power supply voltage V1 to be reduced in the FDD communication.

In contrast, in the TDD communication, the power supply voltage higher than that in the FDD communication is required. It is necessary for the power supply voltage V2 of the second power amplifier 82 to be higher than the power supply voltage V1 of the first power amplifiers 81. The power supply voltage V2 is supplied to the second power amplifier 82 via no filter. Since no attenuation in the filter 4 is caused, it is possible to apply the power supply voltage V2 of a desired voltage value with no loss in the TDD communication. In contrast, the noise component of the power supply voltage V1 in the FDD communication can be reduced.

(5.5) Fifth Modification

As a fifth modification of the fourth embodiment, the filter 4 may be an integrated passive device (IPD) including inductors and capacitors.

It should be appreciated that the same advantages as those of the tracker module 1c according to the fourth embodiment are achieved also in the tracker modules according to the respective modifications described above.

Modifications

Modifications concerning the first to fourth embodiments will now be described.

First Modification

As a first modification of the first to fourth embodiments, the tracker module 1, the first power amplifiers 81, and the second power amplifier 82 may be formed as one power amplifier module. In other words, the power amplifier module includes the tracker module 1, the first power amplifiers 81, and the second power amplifier 82. The power amplifier module may include the tracker module 1a according to the second embodiment, the tracker module 1b according to third embodiment, or the tracker module 1c according to the fourth embodiment, instead of the tracker module 1 according to the first embodiment.

In the power amplifier module according to the first modification, the three or more first output terminals 6 are arranged along the outermost periphery on the second main surface 22 of the substrate 2 in the tracker module 1. This facilitates leading from each first output terminal 6 on the substrate (e.g., the mother board or the like) on which the tracker module 1 is arranged.

(2) Second Modification

As a second modification of the first to fourth embodiments, the tracker module 1, the first power amplifiers 81, the second power amplifier 82, the first transmission filter 83, and the second transmission filter (not illustrated) may compose one module, that is, a radio-frequency module. The radio-frequency module according to the second modification includes the tracker module 1, the first power amplifiers 81, the second power amplifier 82, and the first transmission filters 83 and 84. The radio-frequency module may include the tracker module 1a according to the second embodiment, the tracker module 1b according to the third embodiment, or the tracker module 1c according to the fourth embodiment, instead of the tracker module 1 according to the first embodiment.

In the radio-frequency module according to the second modification, the three or more first output terminals 6 are arranged along the outermost periphery on the second main surface 22 of the substrate 2 in the tracker module 1. This facilitates leading from each first output terminal 6 on the substrate (e.g., the mother board or the like) on which tracker module 1 is arranged.

In general, it is noted that the embodiments and the modifications described above are only part of the various embodiments and modifications of the present invention. In addition, various changes may be made to the embodiments and the modifications depending on the design or the like as long as the object of the present invention is achieved.

In the description, it is noted that the term "an element is arranged on the first main surface 21 of the substrate 2" includes not only a case in which the element is directly mounted on the first main surface 21 of the substrate 2 but also a case in which the element is arranged in a space at the first main surface 21 side, among the space at the first main surface 21 side and a space at the second main surface 22 side isolated with the substrate 2. In other words, "an element is arranged on the first main surface 21 of the substrate 2" includes a case in which the element is mounted on the first main surface 21 of the substrate 2 with another circuit component, an electrode, or the like interposed therebetween. The element is, for example, the tracker component 3 or the filter 4. However, the element is not limited to the tracker component 3 and the filter 4.

In the description, it is noted that the term "an element is arranged on the second main surface 22 of the substrate 2" includes not only a case in which the element is directly mounted on the second main surface 22 of the substrate 2 but also a case in which the element is arranged in a space at the second main surface 22 side, among a space at the first main surface 21 side and the space at the second main surface 22 side isolated with the substrate 2. In other words, "an element is arranged on the second main surface 22 of the substrate 2" includes a case in which the element is mounted on the second main surface 22 of the substrate 2 with another circuit component, an electrode, or the like interposed therebetween. The element is, for example, the first output terminal 6 or the second output terminal 7. It is noted that the element is not limited to the first output terminal 6 and the second output terminal 7.

In the description, it is noted that the term "a first element is overlapped with a second element in a plan view from the thickness direction of the substrate 2" includes a case in which the entire first element is overlapped with the entire second element, a case in which the entire first element is overlapped with part of the second element, a case in which part of the first element is overlapped with the entire second element, and a case in which part of the first element is overlapped with part of the second element, in a plan view from the thickness direction of the substrate 2. In sum and for purposes of this disclosure, the term "a first element is overlapped with a second element in a plan view from the thickness direction of the substrate 2" means that "at least part of the first element is overlapped with at least part of the second element." A combination of the first element and the second element is, for example, a combination in which the first element is the first output terminal 6 and the second element is the tracker component 3 or a combination in which the first element is the second output terminal 7 and the second element is the tracker component 3. It is noted that the combination of the first element and the second element is not limited to the above combinations.

In the description, the term "among a first element, a second element, and a third element mounted on the substrate, the third element is arranged between the first element and the second element in a plan view from the thickness direction of the substrate" means that at least one of multiple line segments connecting an arbitrary point in the first element to an arbitrary point in the second element passes through at least part of the third element in a plan view from the thickness direction of the substrate. The "plan view from the thickness direction of the substrate" means that the substrate and electronic components mounted on the substrate are orthogonally projected on a plane parallel to the main surfaces of the substrate for viewing.

Exemplary Aspects

The following aspects are disclosed in the description.

According to a first exemplary aspect, the tracker module (1; 1*a*; 1*b*; 1*c*) is configured to output the power supply voltage (V1; V2) to the multiple power amplifiers. The tracker modules (1; 1*a*; 1*b*; 1*c*) includes the substrate (2), the tracker component (3; 3*a*; 3*b*), and the multiple external connection terminals (5). The substrate (2) has the first main surface (21) and the second main surface (22) that are opposed to each other. The tracker component (3; 3*a*; 3*b*) is arranged on the first main surface (21) of the substrate (2) and generates the power supply voltage (V1; V2). The multiple external connection terminals (5) are arranged on the second main surface (22) of the substrate (2). The multiple external connection terminals (5) include the three or more first output terminals (6). The three or more first output terminals (6) correspond to the three or more first power amplifiers (81), among the multiple power amplifiers. Each of the three or more first output terminals (6) is connected to the tracker component (3; 3*a*; 3*b*) and is a terminal connected to the corresponding first power amplifier (81), among the three or more first power amplifiers (81). The three or more first output terminals (6) are arranged along the outermost periphery on the second main surface (22) of the substrate (2).

With the tracker module (1; 1*a*; 1*b*; 1*c*) according to the first exemplary aspect, leading from each first output terminal (6) is facilitated on the substrate (the mother board or the like) on which the tracker module (1; 1*a*; 1*b*; 1*c*) is arranged. In other words, the wiring lengths between the first output terminals (6) connected to the first power amplifiers (81) and the first power amplifiers (81) can be shortened. In addition, the wiring layout between the first output terminals (6) connected to the first power amplifiers (81) and the first power amplifiers (81) is simplified.

In another exemplary aspect of the tracker module (1; 1*a*; 1*b*; 1*c*), the three or more first output terminals (6) are arranged so as not to be adjacent to each other on the second main surface (22) of the substrate (2).

With the tracker module (1; 1*a*; 1*b*; 1*c*) according to this exemplary aspect, the isolation between the first output terminals (6) is improved.

In another exemplary aspect of the tracker module (1; 1*a*; 1*b*; 1*c*), the substrate (2) has a polygonal shape in a plan view from the thickness direction of the substrate (2). At least two first output terminals (6), among the three or more first output terminals (6), are arranged along two different end edges of the substrate (2).

With the tracker module (1; 1*a*; 1*b*; 1*c*) according to this exemplary aspect, the first output terminals (6) are easily laid out in a wide range.

In another exemplary aspect of the tracker module (1; 1*a*; 1*b*; 1*c*), the two end edges of the substrate (2) are opposed to each other.

With the tracker module (1; 1*a*; 1*b*; 1*c*) according to this exemplary aspect, the isolation between the first output terminals (6) is improved.

In another exemplary aspect of the tracker module (1; 1*a*; 1*b*; 1*c*), at least two of the three or more first power amplifiers (81) are configured for the simultaneous communication.

In another exemplary aspect of the tracker module (1*b*), at least three of the three or more first power amplifiers (81) are configured for the simultaneous communication.

In another exemplary aspect of the tracker module (1*c*), each of the three or more first output terminals (6) is connected to the corresponding first power amplifier (81) via the filter (4).

With the tracker module (1*c*) according to this exemplary aspect, the noise component of the power supply voltage (V1) to be supplied to the first power amplifiers (81) is reduced.

In another exemplary aspect of the tracker module (1*c*), the filter (4) is a low pass filter.

In another exemplary aspect of the tracker module (1*a*; 1*b*; 1*c*), the multiple external connection terminals (5) further include the second output terminal (7). Moreover, the second output terminal (7) is different from the three or more first output terminals (6) and is connected to the second power amplifier (82), among the multiple power amplifiers, and is arranged at a position different from the outermost periphery on the second main surface (22) of the substrate (2).

In another exemplary aspect of the tracker module (1*a*; 1*b*; 1*c*), the maximum load current flowing through the second output terminal (7) is greater than the maximum load current flowing through each of the three or more first output terminals (6).

With the tracker module (1a; 1b; 1c) according to this exemplary aspect, the high-power supply power can be supplied to the second power amplifier (82) through the second output terminal (7).

In another exemplary aspect of the tracker module (1a; 1b; 1c), the power class of the second power amplifier (82) connected to the second output terminal (7) is higher than the power class of each of the three or more first power amplifiers (81) connected to the three or more first output terminals (6).

With the tracker module (1a; 1b; 1c) according to this exemplary aspect, the high-power supply power can be supplied to the second power amplifier (82) of the high power class.

In another exemplary aspect of the tracker module (1a; 1b; 1c), the second output terminal (7) is connected to the second power amplifier (82) via no filter.

In another exemplary aspect of the tracker module (1a; 1b; 1c), each of the three or more first power amplifiers (81) connected to the three or more first output terminals (6) is a power amplifier that amplifies an FDD transmission signal. The second power amplifier (82) connected to the second output terminal (7) is a power amplifier that amplifies a TDD transmission signal.

In another exemplary aspect, a power amplifier module includes the tracker module (1; 1a; 1b; 1c) in any of the exemplary aspects above and the first power amplifiers (81).

With the power amplifier module according to this exemplary aspect, in the tracker module (1; 1a; 1b; 1c), leading from each first output terminal (6) is facilitated on the substrate (the mother board or the like) on which the tracker module (1; 1a; 1b; 1c) is arranged. In other words, the wiring lengths between the first output terminals (6) connected to the first power amplifiers (81) and the first power amplifiers (81) in the tracker module (1; 1a; 1b; 1c) can be shortened. In addition, the wiring layout is simplified between the first output terminals (6) connected to the first power amplifiers (81) and the first power amplifiers (81) in the tracker module (1; 1a; 1b; 1c).

In another exemplary aspect, a radio-frequency module is provided that includes the tracker module (1; 1a; 1b; 1c) in any of the exemplary aspects above, the first power amplifiers (81), and the transmission filter (the first transmission filter 83; 84). The transmission filter transmits a transmission signal amplified by the first power amplifiers (81).

With the radio-frequency module according to this exemplary aspect, in the tracker module (1; 1a; 1b; 1c), leading from each first output terminal (6) is facilitated on the substrate (the mother board or the like) on which the tracker module (1; 1a; 1b; 1c) is arranged. In other words, the wiring lengths between the first output terminals (6) connected to the first power amplifiers (81) and the first power amplifiers (81) in the tracker module (1; 1a; 1b; 1c) can be shortened. In addition, the wiring layout is simplified between the first output terminals (6) connected to the first power amplifiers (81) and the first power amplifiers (81) in the tracker module (1; 1a; 1b; 1c).

In another exemplary aspect, a communication device (9) is provided that includes the tracker module (1; 1a; 1b; 1c) in any of the above exemplary aspects, the first power amplifiers (81), and the signal processing circuit (92). The signal processing circuit (92) outputs a transmission signal to the first power amplifiers (81).

With the communication device (9) according to this exemplary aspect, in the tracker module (1; 1a; 1b; 1c), leading from each first output terminal (6) is facilitated on the substrate (the mother board or the like) on which the tracker module (1; 1a; 1b; 1c) is arranged. In other words, the wiring lengths between the first output terminals (6) connected to the first power amplifiers (81) and the first power amplifiers (81) in the tracker module (1; 1a; 1b; 1c) can be shortened. In addition, the wiring layout can be simplified between the first output terminals (6) connected to the first power amplifiers (81) and the first power amplifiers (81) in the tracker module (1; 1a; 1b; 1c).

REFERENCE SIGNS LIST

1, 1a, 1b, 1c tracker module
2 substrate
21 first main surface
22 second main surface
3, 3a, 3b tracker component
31 terminal
4, 4A, 4B, 4C, 4D filter
5 external connection terminal
51 input terminal
52 control terminal
53 signal terminal
6, 6A, 6B, 6C, 6D, 6E, 6F first output terminal
7 second output terminal
8 radio-frequency module
81, 81A, 81B, 81C, 81D, 81E, 81F first power amplifier
82 second power amplifier
83, 84 first transmission filter
851, 852 first reception filter
861, 862 first low noise amplifier
87 switch
88 external connection terminal
881, 882 signal input terminal
883, 884 signal output terminal
885 antenna terminal
886, 887 terminal
89 controller
9 communication device
91 antenna
92 signal processing circuit
93 baseband signal processing circuit
94 RF signal processing circuit
10 pre-regulator circuit
110 input terminal
111, 112, 113, 114 output terminal
115, 116 inductor connection terminal
117 control terminal
120 control terminal
130 output terminal
131, 132, 133, 134 input terminal
135 control terminal
140 input terminal
141 output terminal
20 switched-capacitor circuit
30 supply modulator
50 direct current power source
R51 resistor
C11, C12, C13, C14, C15, C16, C21, C22, C23, C24 capacitor
C51, C52 capacitor
C61, C62, C63, C64 capacitor
L51, L52, L53 inductor
L71 power inductor S11, S12, S13, S14, S21, S22, S23, S24, S31, S32, S33, S34, S41, S42, S43, S44 switch
S51, S52, S53, S54 switch
S61, S62, S63 switch
S71, S72 switch
N1, N2, N3, N4 node
V1, V2 power supply voltage
V1, V12, V13, V14 voltage

The invention claimed is:

1. A tracker module that outputs a voltage to a plurality of power amplifiers, the tracker module comprising:
a substrate having a first main surface and a second main surface that oppose each other;
a tracker component on the first main surface of the substrate and configured to generate the voltage; and
a plurality of external connection terminals on the second main surface of the substrate and that include three or more first output terminals corresponding to three or more first power amplifiers of the plurality of power amplifiers,
wherein each of the three or more first output terminals is connected to the tracker component and is a terminal connected to a respective first power amplifier of the three or more first power amplifiers, and
wherein the three or more first output terminals are arranged along an outermost periphery on the second main surface of the substrate.

2. The tracker module according to claim 1, wherein the three or more first output terminals are not adjacent to each other on the second main surface of the substrate.

3. The tracker module according to claim 1,
wherein the substrate has a polygonal shape in a plan view from a thickness direction thereof, and
wherein at least two first output terminals of the three or more first output terminals are arranged along two different end edges of the substrate.

4. The tracker module according to claim 3, wherein the two end edges of the substrate oppose each other.

5. The tracker module according to claim 1, wherein at least two of the three or more first power amplifiers are configured for simultaneous communication.

6. The tracker module according to claim 5, wherein at least three of the three or more first power amplifiers are configured for the simultaneous communication.

7. The tracker module according to claim 1, further comprising a filter that connects each of the three or more first output terminals to the respective first power amplifier.

8. The tracker module according to claim 7, wherein the filter is a low pass filter.

9. The tracker module according to claim 1, wherein the plurality of external connection terminals further includes a second output terminal different from the three or more first output terminals.

10. The tracker module according to claim 9, wherein the second output terminal is connected to a second power amplifier of the plurality of power amplifiers, the second output terminal being arranged at a position different from the outermost periphery on the second main surface of the substrate.

11. The tracker module according to claim 10, wherein a maximum load current flowing through the second output terminal is greater than a maximum load current flowing through each of the three or more first output terminals.

12. The tracker module according to claim 10, wherein the second power amplifier connected to the second output terminal comprises a higher power class than a power class of each of the three or more first power amplifiers connected to the three or more first output terminals.

13. The tracker module according to claim 10, wherein the second output terminal is connected to the second power amplifier without a filter therebetween.

14. The tracker module according to claim 10, wherein each of the three or more first power amplifiers connected to the three or more first output terminals is a power amplifier configured to amplify a frequency division duplex transmission signal.

15. The tracker module according to claim 14, wherein the second power amplifier connected to the second output terminal is a power amplifier configured to amplify a time division duplex transmission signal.

16. A tracker module that outputs a voltage to a plurality of power amplifiers, the tracker module comprising:
a substrate having a first main surface and a second main surface that oppose each other;
a tracker component on the first main surface of the substrate and configured to generate the voltage; and
a plurality of external connection terminals on the second main surface of the substrate and that include three or more first output terminals that are connected to the tracker component and that correspond to three or more first power amplifiers of the plurality of power amplifiers,
wherein the three or more first output terminals are arranged along a periphery on the second main surface of the substrate.

17. The tracker module according to claim 16, wherein the three or more first power amplifiers are configured for simultaneous communication.

18. A power amplifier module comprising:
the tracker module according to claim 1; and
the three or more first power amplifiers.

19. A radio-frequency module comprising:
the tracker module according to claim 1;
the three or more first power amplifiers; and
a transmission filter configured to transmit a transmission signal amplified by the three or more first power amplifiers.

20. A communication device comprising:
the tracker module according to claim 1;
the three or more first power amplifiers; and
a signal processing circuit configured to output a transmission signal to the three or more first power amplifiers.

* * * * *